(12) United States Patent
Kasai et al.

(10) Patent No.: US 9,401,335 B2
(45) Date of Patent: Jul. 26, 2016

(54) SEMICONDUCTOR DEVICE AND ELECTRONIC APPARATUS

(71) Applicant: SEIKO EPSON CORPORATION, Tokyo (JP)

(72) Inventors: Toshiyuki Kasai, Okaya (JP); Takeshi Koshihara, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 197 days.

(21) Appl. No.: 14/173,457

(22) Filed: Feb. 5, 2014

(65) Prior Publication Data

US 2014/0232007 A1  Aug. 21, 2014

(30) Foreign Application Priority Data

Feb. 20, 2013  (JP) .................. 2013-031079

(51) Int. Cl.
| | |
|---|---|
| *H01L 23/48* | (2006.01) |
| *H01L 23/52* | (2006.01) |
| *H01L 29/40* | (2006.01) |
| *H01L 23/60* | (2006.01) |

(52) U.S. Cl.
CPC ......... H01L 23/60 (2013.01); *H01L 2924/0002* (2013.01)

(58) Field of Classification Search
USPC ................................ 257/737, 773
See application file for complete search history.

(56) References Cited

U.S. PATENT DOCUMENTS

| | | | |
|---|---|---|---|
| 6,313,900 B1 | 11/2001 | Kawata | |
| 2004/0061438 A1* | 4/2004 | Yamazaki | H01L 27/1214 313/506 |
| 2008/0150142 A1* | 6/2008 | Saito | H01L 21/76838 257/752 |
| 2008/0204618 A1 | 8/2008 | Jung et al. | |
| 2010/0007024 A1* | 1/2010 | Uchikoshi | H01L 21/76801 257/758 |
| 2010/0253222 A1* | 10/2010 | Koshihara | H01L 51/5265 315/32 |
| 2010/0265024 A1* | 10/2010 | Nakashiba | H01L 23/48 336/200 |

FOREIGN PATENT DOCUMENTS

| | | |
|---|---|---|
| JP | A-2000-066241 | 3/2000 |
| JP | B2-3208998 | 9/2001 |
| JP | A-2005-266683 | 9/2005 |
| JP | A-2008-203856 | 9/2008 |
| JP | B2-4283456 | 6/2009 |
| JP | A-2009-181094 | 8/2009 |
| JP | A-2009-181095 | 8/2009 |

* cited by examiner

*Primary Examiner* — Marc Armand
*Assistant Examiner* — Wilner Jean Baptiste
(74) *Attorney, Agent, or Firm* — Oliff PLC

(57) ABSTRACT

A semiconductor device that is connected to a wiring substrate includes a semiconductor substrate, a circuit provided on the semiconductor substrate, a connection terminal, and a guard ring that is provided on a peripheral region. In the semiconductor device, the guard ring includes a plurality of wiring layers, and a wiring layer included in the guard ring, which is the farthest from the semiconductor substrate, corresponds to a wiring layer closer to the semiconductor substrate relative to a wiring layer of the connection terminal.

20 Claims, 17 Drawing Sheets

SEMICONDUCTOR DEVICE AND ELECTRONIC APPARATUS

BACKGROUND

1. Technical Field

The present invention relates to a semiconductor device and an electronic apparatus.

2. Related Art

In a manufacturing process of semiconductor devices such as light emitting devices using light emitting elements like organic light emitting diode (hereinafter, referred to as "OLED") elements or the like and complementary metal oxide semiconductor (CMOS) image sensors, circuits corresponding to a plurality of semiconductor devices are formed on a large-sized substrate first, and then, the respective semiconductor devices are cut out from the large-sized substrate normally.

Then, provided is a guird ring made of a metal material along a cutting surface (scribe line) for the cutout such that mechanical influences and electrostatic influences generated in the scribe process of cutting out the respective semiconductor devices from the large-sized substrate are not exerted upon the circuits formed on the substrate (for example, see JP-A-2000-066241).

A flexible wiring substrate is connected to the semiconductor device. To be more specific, a conductive pattern of the flexible wiring substrate is connected to a connection terminal of the semiconductor device through an opening provided in a surface protection layer of the semiconductor device. With this, the semiconductor device and the flexible wiring substrate are connected.

However, with the configuration, conductive particles contained in the conductive pattern of the flexible wiring substrate break through the surface protection layer to electrically connect the guard ring with the conductive pattern in some cases. As a result, short-circuit of the conductive pattern of the flexible wiring substrate and the guard ring is generated in some cases.

SUMMARY

An advantage of some aspects of the invention is to prevent short-circuit of a conductive pattern of a flexible wiring substrate and a guard ring from being generated.

A semiconductor device according to an aspect of the invention that is connected to a wiring substrate includes a semiconductor substrate, a circuit provided on the semiconductor substrate, a connection terminal that is connected to a conductive pattern included in the wiring substrate and is made of a conductive material, and a guard ring that is made of a conductive material and is provided on a peripheral region as a region between a circuit formation region on which the circuit and the connection terminal are provided and an outer edge of the semiconductor substrate when the semiconductor substrate is seen from the above. In the semiconductor device, the guard ring includes a plurality of wiring layers, and a wiring layer included in the guard ring, which is the farthest from the semiconductor substrate, corresponds to a wiring layer closer to the semiconductor substrate relative to a wiring layer on which the connection terminal is provided on a connection region on the peripheral region, which overlaps with the wiring substrate when the semiconductor substrate is seen from the above.

With the aspect of the invention, in a state where the semiconductor device and the wiring substrate are connected, a distance between the wiring layer on which the guard ring is provided and the wiring substrate can be made larger than a distance between the wiring layer on which the connection terminal is provided and the wiring substrate. This makes it possible to prevent short-circuit between the guard ring and the conductive pattern of the wiring substrate from being generated.

In the semiconductor device according to the above-mentioned aspect of the invention, it is preferable that a power supply unit for supplying a predetermined potential to the semiconductor substrate be further included and the guard ring be connected to the semiconductor substrate.

With the aspect of the invention, the predetermined potential is supplied to the guard ring from the power supply unit through the semiconductor substrate. Therefore, the potential of the guard ring can be kept at the predetermined potential stably. As a result, the guard ring can be made to function as a shield for preventing electric noise from the outside of the semiconductor device from transmitting to the inside of the semiconductor device.

In the semiconductor device according to the above-mentioned aspect of the invention, it is preferable that the semiconductor substrate include an impurity injection layer that is provided on a region formed by at least a part of the circuit formation region and at least a part of the peripheral region, and the guard ring be connected to the impurity injection layer of the semiconductor substrate.

In the semiconductor device according to the above-mentioned aspect of the invention, it is preferable that the semiconductor substrate include an impurity injection layer that is provided on a region formed by at least a part of the circuit formation region and at least a part of the peripheral region, a first impurity diffusion layer that is provided on a part of the region on which the impurity injection layer is provided on the circuit formation region, and a second impurity diffusion layer that is provided on a part of the region on which the impurity injection layer is provided on the peripheral region, the power supply unit be connected to the first impurity diffusion layer, and the guard ring be connected to the second impurity diffusion layer.

In the semiconductor device according to the above-mentioned aspect of the invention, it is preferable that the wiring layer included in the guard ring, which is the farthest from the semiconductor substrate, be provided on the same layer as the wiring layer on which the connection terminal is provided on a part or the entire of the peripheral region excluding the connection region. With the aspect of the invention, the guard ring is provided to the same layer as the wiring layer on which the connection terminal is provided on the region excluding the connection region. This makes it possible to prevent short-circuit between the guard ring and the conductive pattern of the wiring substrate from being generated and prevent moisture, electric noise, and the like from entering from the outside at the same time.

Further, a semiconductor device according to another aspect of the invention that is connected to a wiring substrate includes a substrate, a circuit provided on the substrate, a power supply unit for supplying a predetermined potential, a connection terminal that is connected to a conductive pattern included in the wiring substrate and is made of a conductive material, and a guard ring that is made of a conductive material and is provided on a peripheral region as a region between a circuit formation region on which the circuit, the power supply unit, and the connection terminal are provided and an outer edge of the substrate when the substrate is seen from the above. In the semiconductor device, the guard ring includes a plurality of wiring layers and the predetermined potential is supplied to the guard ring from the power supply unit, and a wiring layer included in the guard ring, which is the farthest from the substrate, corresponds to a wiring layer closer to the substrate relative to a wiring layer on which the connection terminal is provided on a connection region on the peripheral region, which overlaps with the wiring substrate when the substrate is seen from the above.

With the aspect of the invention, in a state where the semiconductor device and the wiring substrate are connected, a distance between the wiring layer on which the guard ring is provided and the wiring substrate can be made larger than a distance between the wiring layer on which the connection terminal is provided and the wiring substrate. This makes it possible to prevent short-circuit between the guard ring and the conductive pattern of the wiring substrate from occurring.

Further, the predetermined potential is supplied to the guard ring from the power supply unit. Therefore, the potential of the guard ring can be kept at the predetermined potential stably. As a result, the guard ring can be made to function as a shield for preventing electric noise from the outside of the semiconductor device from transmitting to the inside of the semiconductor device.

In the aspect of the invention, it is sufficient that the semiconductor device is a semiconductor device containing at least a semiconductor element such as a transistor provided on a semiconductor substrate and a thin-film transistor provided on an insulating substrate.

In the semiconductor device according to the above-mentioned aspect of the invention, it is preferable that the guard ring be connected to the substrate.

In the semiconductor device according to the above-mentioned aspect of the invention, it is preferable that the wiring layer included in the guard ring, which is the farthest from the substrate, be provided on the same layer as the wiring layer on which the connection terminal is provided on a part or the entire of the peripheral region excluding the connection region.

With the aspect of the invention, the guard ring is provided to the same layer as the wiring layer on which the connection terminal is provided on the region excluding the connection region. This makes it possible to prevent short-circuit between the guard ring and the conductive pattern of the wiring substrate from being generated and prevent moisture, electric noise, and the like from entering from the outside.

In the semiconductor device according to the above-mentioned aspect of the invention, it is preferable that the guard ring include a contact plug that electrically connects the plurality of wiring layers included in the guard ring to one another.

In the semiconductor device according to the above-mentioned aspect of the invention, it is preferable that the circuit include a pixel circuit for displaying an image or a sensor circuit for capturing an image.

It can be also considered that electronic apparatuses having the semiconductor device therein in addition to the semiconductor device are included conceptually in the invention. As the electronic apparatuses, exemplified are display apparatuses such as a head mount display (HMD) and an electronic viewfinder and sensors for capturing images, such as a CMOS image sensor and a CCD image sensor.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
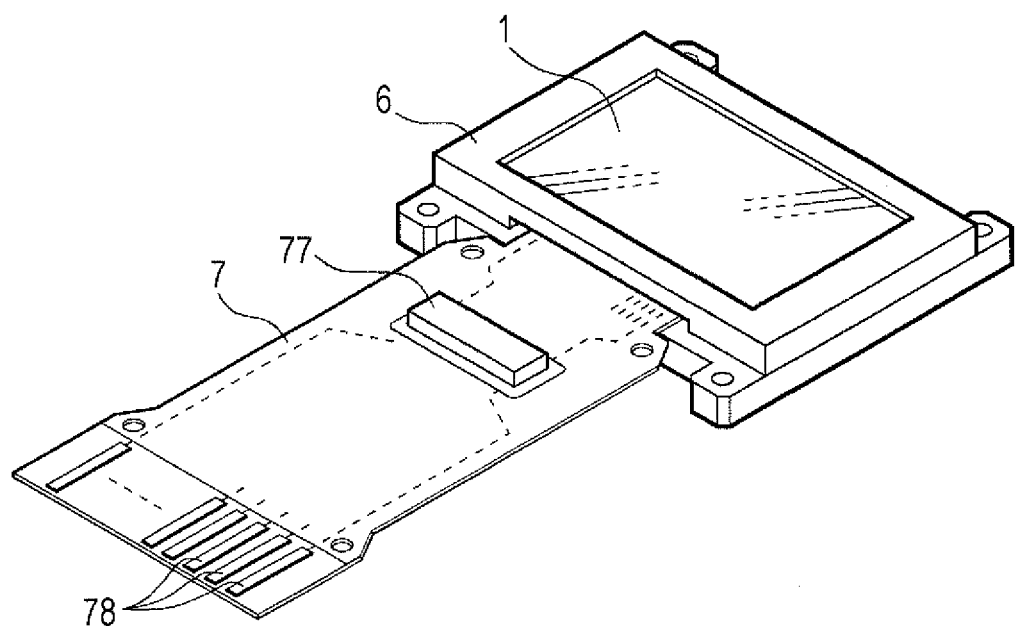
FIG. 1 is a perspective view illustrating a configuration of a semiconductor device according to a first embodiment.

Hereinafter, described are modes for carrying out the invention with reference to the drawings. In the drawings, dimensions and scales of respective parts are made different from actual dimensions and scales appropriately. Further, the embodiments as will be described below are preferable specific examples of the invention, so that various preferable technical limitations are made in the embodiments. However, the scope of the invention is not limited to these embodiments unless description limiting the invention is particularly made in the following description.

First Embodiment

FIG. 1 is a perspective view illustrating a semiconductor device 1 according to an embodiment of the invention and a flexible printed circuit (FPC) substrate 7 (serving as an example of "wiring substrate") that is connected to the semiconductor device 1.

The semiconductor device 1 includes a plurality of pixel circuits and a driving circuit that drives the pixel circuits. In the embodiment, the plurality of pixel circuits and the driving circuit included in the semiconductor device 1 are formed on a semiconductor substrate. An OLED serving as an example of a light emitting element is used for the pixel circuit. For example, the semiconductor device 1 is accommodated in a frame-like case 6 that opens in a display portion and one end of an FPC substrate 7 is connected to the semiconductor device 1. In the embodiment, description is made by using the semiconductor device 1 in which the pixel circuits and the like are formed on the semiconductor substrate as an example. However, it is sufficient that the semiconductor device in the present specification includes at least a semiconductor element such as a transistor provided on a semiconductor substrate and a thin-film transistor provided on an insulating substrate.

A control circuit 77 of a semiconductor chip is mounted on the FPC substrate 7 by a chip on film (COF) technique and a plurality of connection terminals 78 are provided on the FPC substrate 7. The FPC substrate 7 is connected to a high-level circuit (not illustrated). A plurality of conductive patterns (not illustrated in FIG. 1) are patterned on the FPC substrate 7.

Digital image data is supplied to the control circuit 77 from the high-level circuit in synchronization with a synchronization signal. The image data is data that defines gradation levels of pixels of an image to be displayed by the semiconductor device 1 by 8 bits, for example. The synchronization signal is a signal including a vertical synchronization signal, a horizontal synchronization signal, and a dot clock signal. The control circuit 77 generates control signals of various types based on the synchronization signal, supplies them to the semiconductor device 1, generates an analog image signal based on the image data, and supplies it to the semiconductor device 1.

Figure 2:
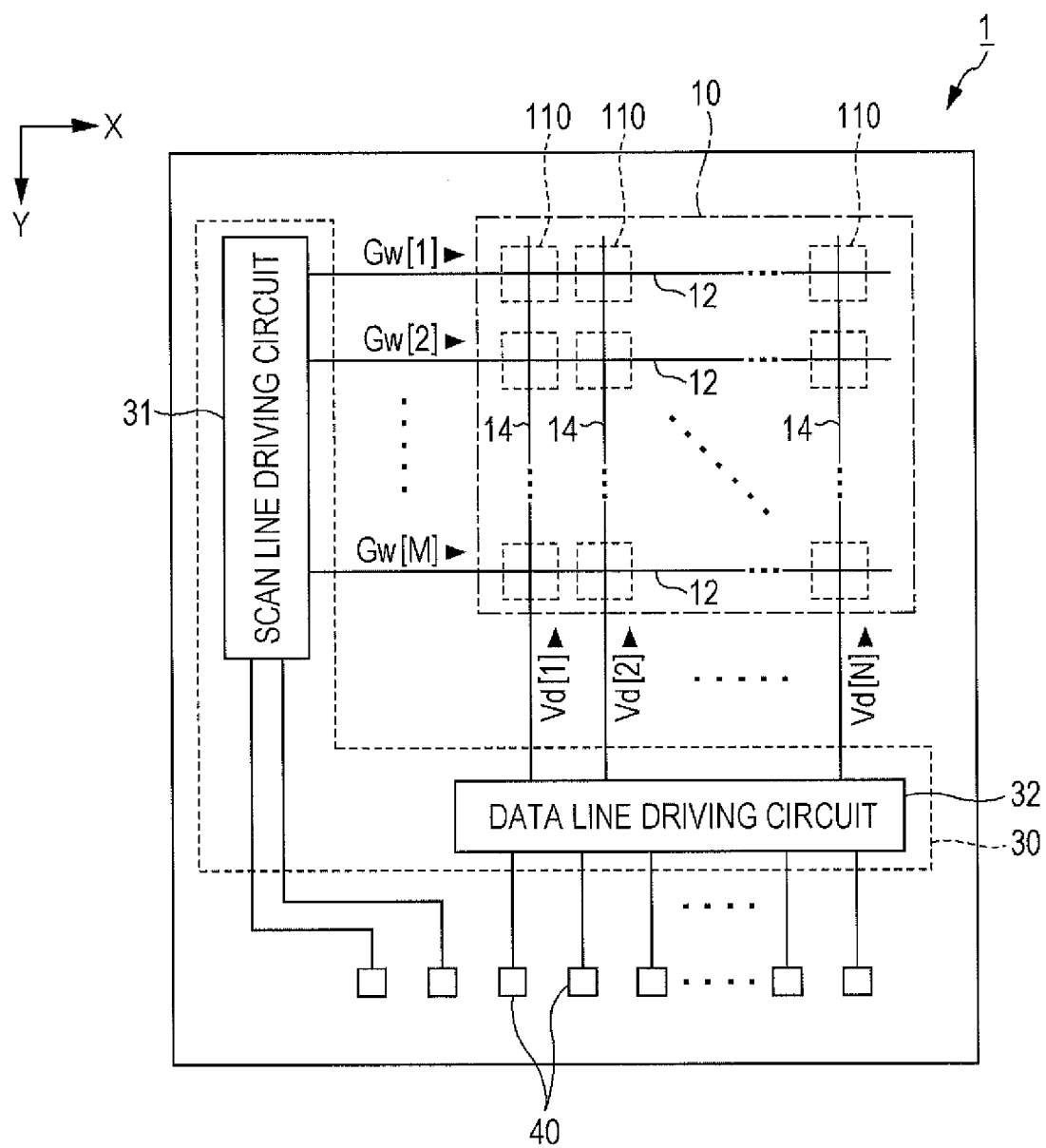
FIG. 2 is a block diagram illustrating a configuration of the semiconductor device.

FIG. 2 is a block diagram illustrating a configuration of the semiconductor device 1 according to the embodiment.

As illustrated in FIG. 2, in the semiconductor device 1, a plurality of pixel circuits 110 corresponding to the pixels of the image to be displayed are aligned on a display portion 10 in a matrix form. To be specific, scan lines 12 of M rows are provided so as to extend in the transverse direction (X direction) in FIG. 2 and data lines 14 of N columns are provided so as to extend in the lengthwise direction (Y direction) in FIG. 2 on the display portion 10. The data lines 14 and the scan lines 12 are kept to be electrically insulated from one another. The pixel circuits 110 are provided so as to correspond to the intersecting portions between the scan lines 12 of M rows and the data lines 14 of N columns. Note that both of M and N are natural numbers. Each of the pixel circuits 110 includes one or a plurality of transistors, a light emitting element such as an organic light emitting diode (hereinafter, referred to as "OLED"), and a holding capacity.

In the embodiment, one or the plurality of transistors included in each pixel circuit 110 may be N-channel transistors, P-channel transistors, or transistors including both the N-channel transistor and the P-channel transistor. Further, in the embodiment, the transistors included in the pixel circuit 110 may be MOS-type transistors having an active layer on the semiconductor substrate, thin-film transistors, or field-effect transistors.

As illustrated in FIG. 2, the semiconductor device 1 includes a driving circuit 30 that drives the pixel circuits 110. The driving circuit 30 includes a scan line driving circuit 31 and a data line driving circuit 32.

The scan line driving circuit 31 is a unit that scans (selects) the scan lines 12 of the first row to the Mth row on a row-by-row basis based on the control signals which are supplied from the control circuit 77. To be specific, the scan line driving circuit 31 sets scan signals Gw[1] to Gw[M] to a predetermined selected potential by turns for each horizontal scanning period H in one frame period F. The scan signals Gw[1] to Gw[M] are output to the scan lines 12 of the first row to the M row, respectively. With this, the scan line driving circuit 31 consecutively selects the scan lines 12 on the row-by-row basis.

The data line driving circuit 32 generates data voltages Vd[1] to Vd[N] defining the gradations to be displayed by the pixels corresponding to the respective pixel circuits 110 based on the image signals and the control signals that are supplied from the control circuit 77. Further, the data line driving circuit 32 outputs them to the data lines 14 of N columns for each horizontal scanning period H.

Although not illustrated in FIG. 2, the semiconductor device 1 is provided with power supply lines through which a potential VDD at a higher level side on the pixel circuits 110 is supplied and power supply lines through which a potential VSS (serving as an example of "predetermined potential") at a lower level side is supplied. The power supply lines through which the potential VSS as the lower level is supplied may be connected to cathodes of the light emitting elements. On the other hand, the power supply lines through which the potential VDD at the higher level side on the pixel circuits 110 is supplied may be connected to anodes of the light emitting elements through one or the plurality of transistors included in the pixel circuits 110.

As illustrated in FIG. 2, the semiconductor device 1 is provided with a plurality of connection terminals 40 so as to correspond to the plurality of conductive patterns included in the FPC substrate 7. The connection terminals 40 are provided such that one conductive pattern of the plurality of conductive patterns corresponds to one connection terminal of the plurality of connection terminals 40.

Each of the plurality of connection terminals 40 is made of a metal such as aluminum and is electrically connected to the driving circuit 30. To be specific, some of the plurality of connection terminals 40 are electrically connected to the scan line driving circuit 31 and the remaining connection terminals 40 of the plurality of connection terminals 40 are electrically connected to the data line driving circuit 32.

In the embodiment, the connection terminals 40 are made of a metal such as aluminum. However, the connection terminals 40 may be made of indium tin oxide (ITO) or another conductive material.

Next, described is the configuration of the semiconductor device 1 with reference to FIG. 3 to FIG. 6.

Figure 3:
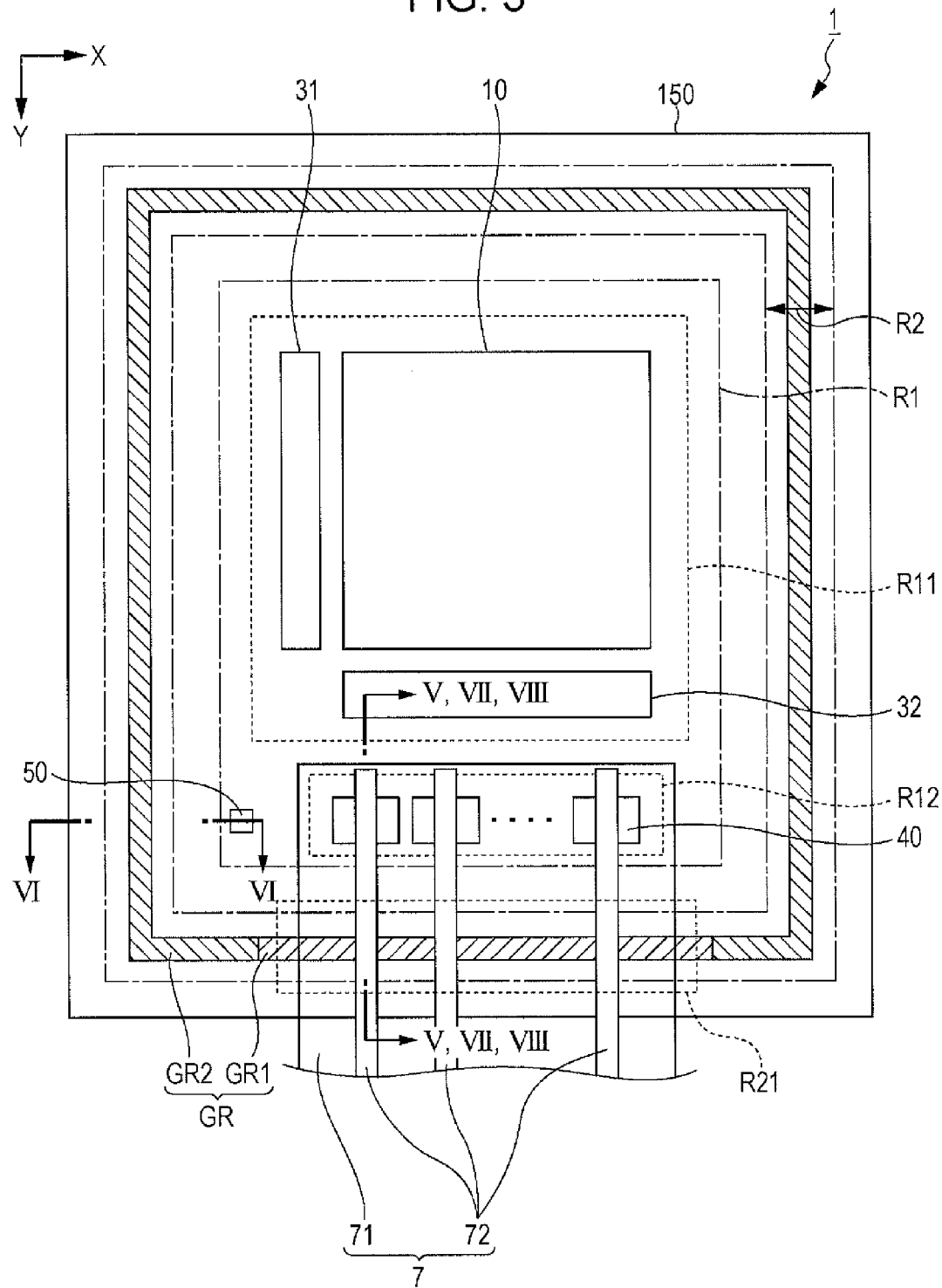
FIG. 3 is a plan view illustrating an outline of the semiconductor device.

FIG. 3 is a plan view illustrating a schematic configuration of the semiconductor device 1 when seen from the direction perpendicular to a surface (hereinafter, referred to as "main surface" in some cases) on which the pixel circuits 110, the driving circuit 30, and the like are formed among the surfaces of a semiconductor substrate 150 included in the semiconductor device 1. In FIG. 3, the FPC substrate 7 that is connected to the semiconductor device 1 is also illustrated in addition to the semiconductor device 1 for the convenience of explanation.

Hereinafter, when the semiconductor device 1 is seen from the direction perpendicular to the main surface on which the pixel circuits 110 and the like are formed of the semiconductor substrate 150, this is referred to as "when seen from the above" simply in some cases.

As illustrated in FIG. 3, the semiconductor device 1 includes the display portion 10 (that is, pixel circuits 110, scan lines 12, and data lines 14), the driving circuit 30 (that is, scan line driving circuit 31 and data line driving circuit 32), and the plurality of connection terminals 40 that are formed on the semiconductor substrate 150.

Hereinafter, a region on which the display portion 10 and the driving circuit 30 are formed when seen from the above is referred to as an internal circuit formation region R11. A region on which the plurality of connection terminals 40 are formed when seen from the above is referred to as a connection terminal formation region R12. Further, a region including the internal circuit formation region R11 and the connection terminal formation region R12 is referred to as a circuit formation region R1. That is to say, the display portion 10, the driving circuit 30, and the plurality of connection terminals 40 are formed on the circuit formation region R1 when seen from the above.

As illustrated in FIG. 3, the semiconductor device 1 includes a guard ring GR made of a metal such as aluminum.

The guard ring GR is provided on a peripheral region R2 so as to surround the display portion 10, the driving circuit 30, and the connection terminal 40 that are formed on the circuit formation region R1 when seen from the above. The peripheral region R2 is a region between the circuit formation region R1 and the outer edge of the semiconductor substrate 150.

In FIG. 3, predetermined spaces are provided between the circuit formation region R1 and the peripheral region R2 and between the outer edge of the semiconductor substrate 150 and the peripheral region R2. However, the circuit formation region R1 and the peripheral region R2, and the outer edge of the semiconductor substrate 150 and the peripheral region R2 may be provided in a contact manner with no space therebetween. That is to say, the peripheral region R2 may be an overall region between the circuit formation region R1 and the outer edge of the semiconductor substrate 150 when seen from the above. In other words, it is sufficient that the guard ring GR is provided between the circuit formation region R1 and the outer edge of the semiconductor substrate 150 so as to surround the circuit formation region R1 when seen from the above.

In the embodiment, the guard ring GR is formed by a first portion GR1 and a second portion GR2. Details of these first portion GR1 and second portion GR2 of the guard ring will be described later.

In the embodiment, the guard ring GR and the connection terminals 40 are made of the same material. However, they may be made of different materials. For example, the connection terminals 40 may be made of ITO and the guard ring GR may be made of aluminum. The guard ring GR may be made of a conductive material other than a metal.

As illustrated in FIG. 3, the semiconductor device 1 includes a power supply unit 50. The power supply unit 50 connects the power supply lines through which the potential VSS is supplied and the semiconductor substrate 150 and is made of a conductive material. The power supply unit 50 is provided on the circuit formation region R1.

As described above, the FPC substrate 7 is connected to the semiconductor device 1. As illustrated in FIG. 3, the FPC substrate 7 includes a plurality of conductive patterns 72 patterned on a substrate 71. The plurality of conductive patterns 72 are formed so as to correspond to the plurality of connection terminals 40. One conductive pattern 72 of the plurality of conductive patterns 72 is connected to one connection terminal 40 of the plurality of connection terminals 40. The number of the plurality of conductive patterns 72 may be larger than the number of the plurality of connection terminals 40. Alternatively, the number of the plurality of connection terminal 40 may be larger than the number of the plurality of conductive pattern 72. In other words, there may be the connection terminals 40 that are not connected to the conductive patterns 72 or the conductive patterns 72 that are not connected to the connection terminals 40. It is sufficient at least some of the plurality of conductive patterns 72 are connected to any of the plurality of connection terminals 40.

Hereinafter, a region of the peripheral region R2, which overlaps with the FPC substrate 7 when seen from the above, is referred to as a connection region R21.

Although details will be described later, in the embodiment, as illustrated in FIG. 3, the first portion GR1 of the guard ring is provided on the connection region R21 (that is, region overlapping with the FPC substrate 7 when seen from the above) and the second portion GR2 of the guard ring is provided on a region of the peripheral region R2 excluding the connection region R21.

Figure 4:
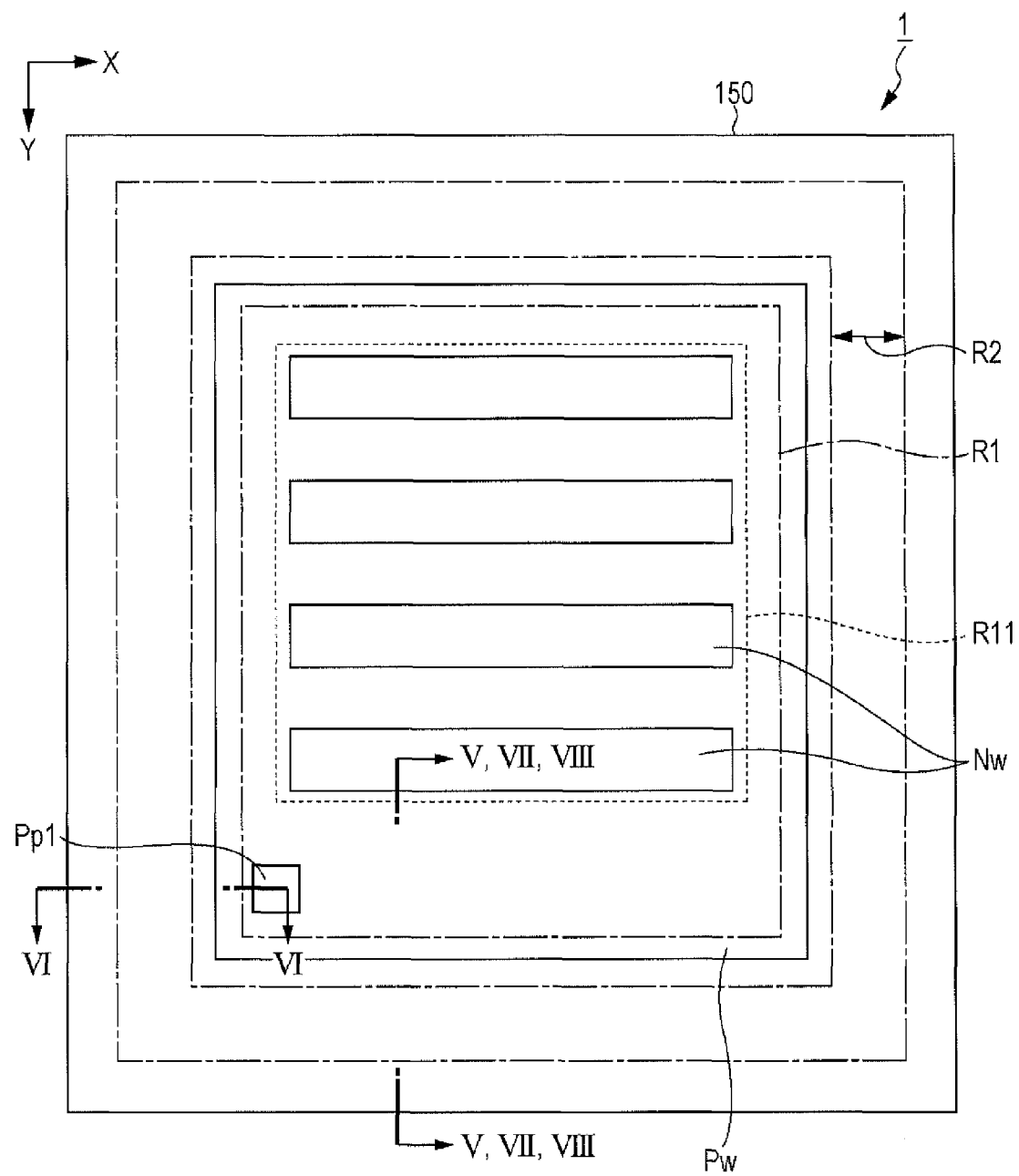
FIG. 4 is a descriptive view for explaining a semiconductor substrate of the semiconductor device.
Figure 5:
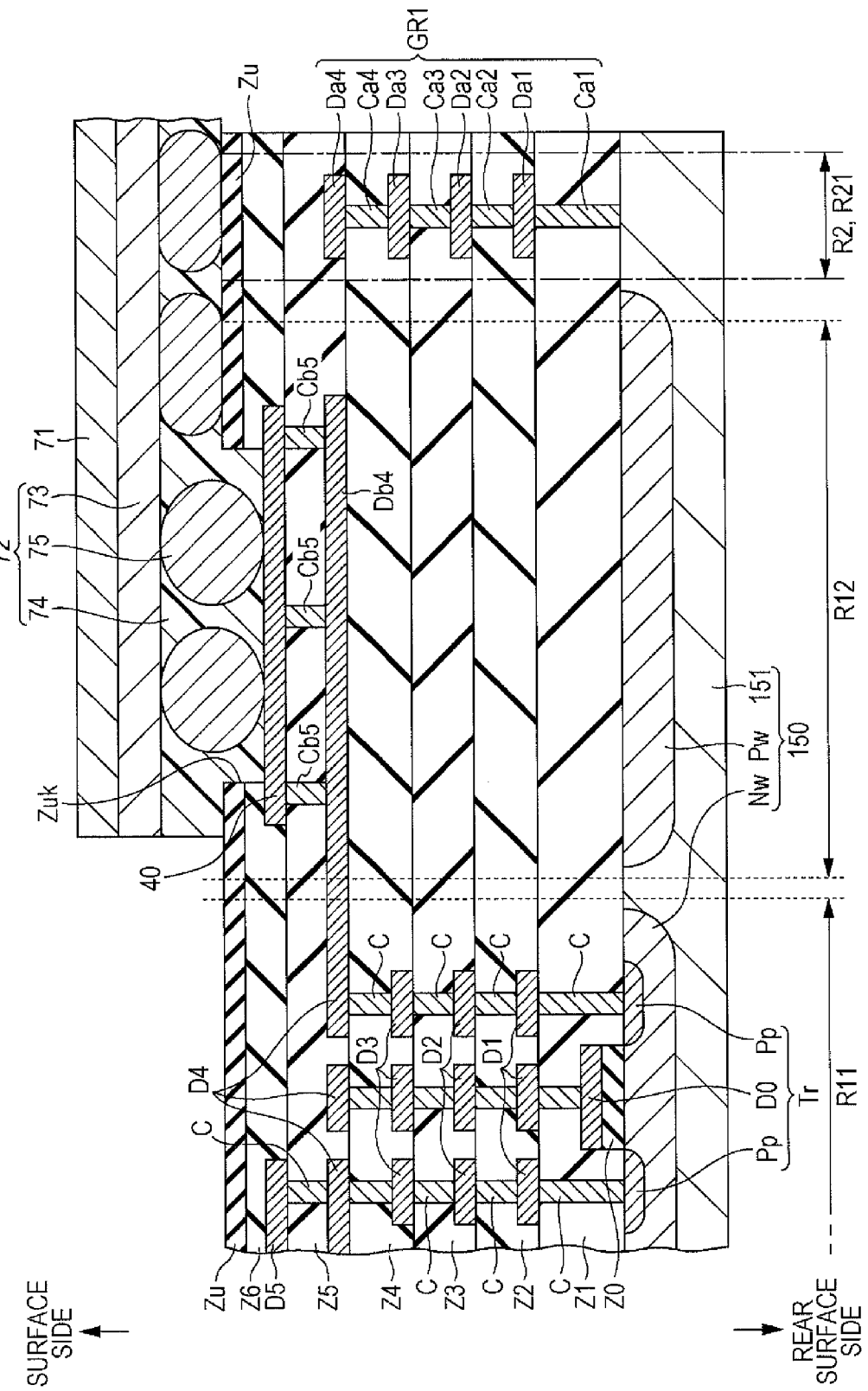
FIG. 5 is a partial cross-sectional view illustrating a configuration of the semiconductor device.
Figure 6:
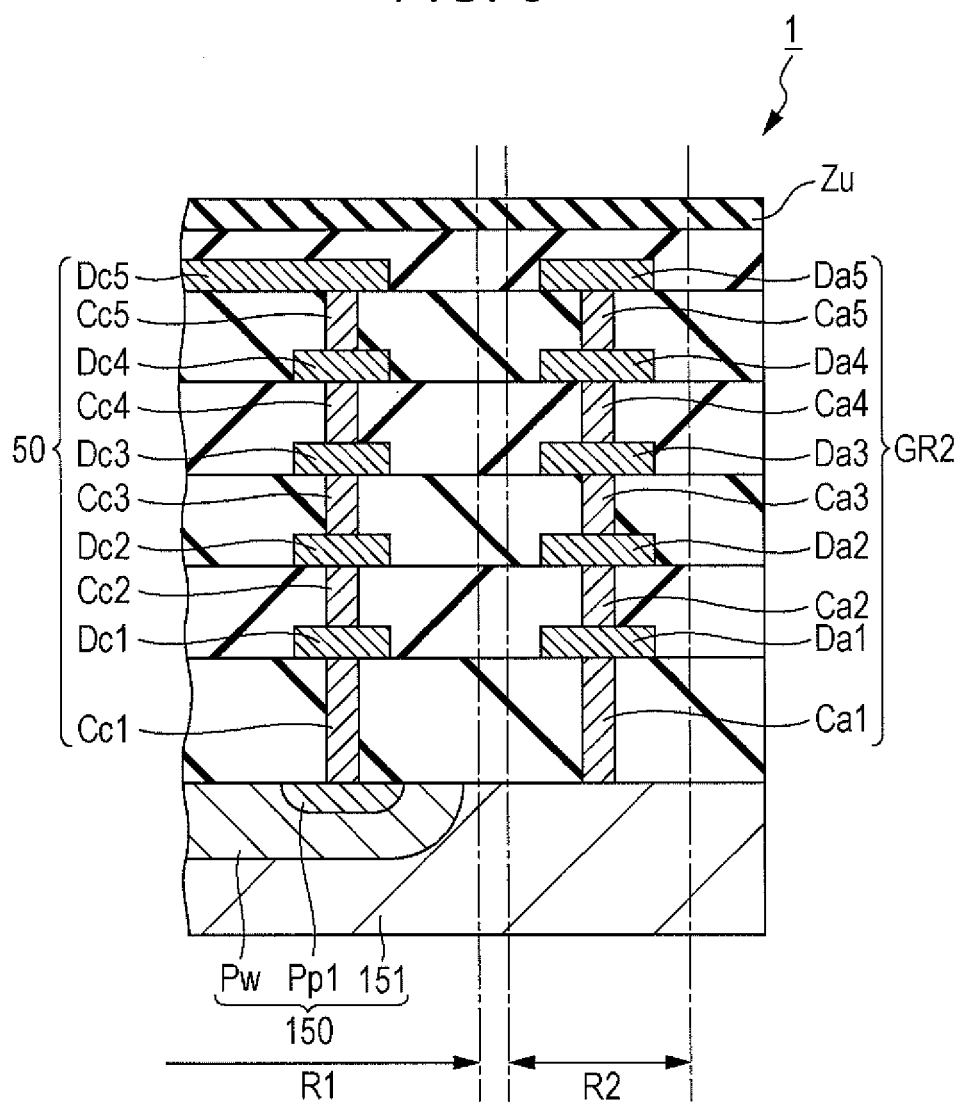
FIG. 6 is a partial cross-sectional view illustrating a configuration of the semiconductor device.

Next, described is the semiconductor substrate 150 with reference to FIG. 4 to FIG. 6.

FIG. 4 is a descriptive view illustrating the main surface of the semiconductor substrate 150. FIG. 5 is a partial cross-sectional view by cutting the semiconductor device 1 and the FPC substrate 7 along a line V-V in FIG. 3 (and FIG. 4). FIG. 6 is a partial cross-sectional view by cutting the semiconductor device 1 along a line VI-VI in FIG. 3 (and FIG. 4).

In the embodiment, a P-type semiconductor substrate is used as the semiconductor substrate 150.

As illustrate in FIG. 4 and FIG. 5, the semiconductor substrate 150 includes a P-type semiconductor layer 151, a P-well Pw (serving as an example of "impurity injection layer"), and N-wells Nws. The P-well Pw is formed by injecting a P-type impurity into the P-type semiconductor layer 151. The N-wells Nws are formed by injecting an N-type impurity into the P-type semiconductor layer 151.

The P-well Pw and the N-wells Nws are formed on the semiconductor substrate 150 at the surface side so as to cover the circuit formation region R1 by implanting ions into the P-type semiconductor layer 151 from the surface side. The N-wells Nws are provided on a part of the internal circuit formation region R11. The P-well Pw is provided so as to cover a region of the circuit formation region R1 excluding the regions on which the N-wells Nws are provided.

As illustrated in FIG. 4 to FIG. 6, the semiconductor substrate 150 includes one or a plurality of P-type impurity diffusion layers Pps(P+) on the circuit formation region R1. The P-type impurity diffusion layer Pp(P+) is formed by injecting the P-type impurity into the P-well Pw or the N-well Nw.

As illustrated in FIG. 4 and FIG. 6, the one or the plurality of P-type impurity diffusion layers Pps include a first P-type impurity diffusion layer Pp1 (serving as an example of "first impurity diffusion layer"). The first P-type impurity diffusion layer Pp1 is formed on the P-well Pw and is connected to the power supply unit 50.

Thus, in the embodiment, the main surface of the semiconductor substrate 150 is covered by the N-wells Nws, the P-well Pw, or the P-type impurity diffusion layers Pps on the circuit formation region R1. On the other hand, the main surface of the semiconductor substrate 150 is covered by the P-type semiconductor layer 151 on the peripheral region R2.

In the embodiment, the P-type semiconductor substrate is used as the semiconductor substrate 150. Alternatively, the N-type semiconductor substrate may be used as the semiconductor substrate 150. In this case, it is sufficient that the P-well Pw, the N-wells Nws, and the P-type impurity diffusion layers Pps referred in the description of the present specification are replaced by an N-well Nw, P-wells Pws, and N-type impurity diffusion layers, respectively.

Next, described is an outline of the configuration of the semiconductor device 1 with reference to FIG. 5 and FIG. 6.

Hereinafter, as illustrated in FIG. 5 and FIG. 6, the direction in which the pixel circuits 110, the guard ring GR, and the like formed on the main surface of the semiconductor substrate 150 are provided when seen from the semiconductor substrate 150 is referred to as the "surface side" and the direction opposite thereto is referred to as the "rear surface side" in some cases.

The respective constituent components arranged on the internal circuit formation region R11 as illustrated in FIG. 5 are merely examples of the pixel circuits 110 or the driving circuit 30. The semiconductor device 1 according to the invention is not limited to the configuration of the internal circuit formation region R11 as illustrated in FIG. 5.

As illustrated in FIG. 5, a gate insulating layer Z0 made of a non-conductive material is provided on the semiconductor substrate 150 at the surface side. Further, a gate wiring layer D0 made of a metal such as aluminum or other conductive material is provided on the gate insulating layer Z0 at the surface side.

In the example as illustrated in FIG. 5, a P-channel transistor Tr is formed on the internal circuit formation region R11. Two P-type impurity diffusion layers Pps of the P-channel transistor Tr are set to a source and a drain and the gate wiring layer D0 thereof is set to a gate.

The semiconductor device 1 is provided with five wiring layers made of a metal such as aluminum or other conductive material on the semiconductor substrate 150 and the gate wiring layer D0 at the surface side. To be specific, the semiconductor device 1 includes the five wiring layers of a first wiring layer D1, a second wiring layer D2, a third wiring layer D3, a fourth wiring layer D4, and a fifth wiring layer D5 in this order from the rear surface side to the surface side.

The wiring layer is a generic term of one or a plurality of conductive terminals or wirings provided on the same layer. For example, in FIG. 5, a wiring Da1 is included in the first wiring layer D1, a wiring Da4 and a wiring Db4 are included in the fourth wiring layer D4, and the connection terminals 40 are included in the fifth wiring layer D5.

The semiconductor device 1 includes a surface protection layer Zu on the fifth wiring layer D5 at the surface side. The surface protection layer Zu is made of a non-conductive material.

Interlayer insulating layers made of a non-conductive material are provided between two adjacent wiring layers, between the wiring layer and the surface protection layer Zu, and between the wiring layer and the semiconductor substrate 150. To be specific, the semiconductor device 1 includes six interlayer insulating layers of a first interlayer insulating layer Z1, a second interlayer insulating layer Z2, a third interlayer insulating layer Z3, a fourth interlayer insulating layer Z4, a fifth interlayer insulating layer Z5, and a sixth interlayer insulating layer Z6 in this order from the rear surface side to the surface side.

The adjacent two wiring layers are connected by contact plugs C penetrating through the interlayer insulating layers. The contact plugs C are connection members that are provided on contact holes opening the interlayer insulating layers. The contact plugs C electrically connect the wiring layers in the interlayer insulating layers at the surface side and the wiring layers thereon at the rear surface side. Further, the contact plugs C are made of a metal such as aluminum or other conductive material.

In the embodiment, the wiring layers on the interlayer insulating layers at the surface side and the wiring layers on the interlayer insulating layers at the rear surface side are electrically connected to each other through the contact plugs C. Alternatively, the wiring layers may be connected by embedding a part of the wiring layers on the interlayer insulating layers at the surface side in the contact holes and connecting the wiring layers on the interlayer insulating layers at the surface side and the wiring layers at the rear surface side directly. That is to say, the connection members that connect the wiring layers on the interlayer insulating layers at both the sides may be provided in the same process as the process of providing the wiring layers on the interlayer insulating layers at the surface side through which the connection members penetrate.

Next, described is a configuration of the guard ring GR with reference to FIG. 3, FIG. 5, and FIG. 6.

As described above, the guard ring GR is provided on the peripheral region R2 of the semiconductor device 1 so as to surround the circuit formation region R1. The guard ring GR is formed by the first portion GR1 and the second portion GR2.

As illustrated in FIG. 5, the first portion GR1 of the guard ring, which is provided on the connection region R21 of the peripheral region R2, includes the wiring Da1 as the first wiring layer D1, a wiring Da2 as the second wiring layer D2, a wiring Da3 as the third wiring layer D3, a wiring Da4 as the fourth wiring layer D4, a contact plug Ca2 connecting the wiring Da1 and the wiring Da2, a contact plug Ca3 connecting the wiring Da2 and the wiring Da3, and a contact plug Ca4 connecting the wiring Da3 and the wiring Da4. Further, the first portion GR1 of the guard ring includes a contact plug Ca1 connecting the P-type semiconductor layer 151 of the semiconductor substrate 150 and the wiring Da1.

As illustrated in FIG. 6, the second portion GR2 of the guard ring, which is provided on the peripheral region R 2 excluding the connection region R21, includes, as conductive layers (terminals), a wiring Da5 as the fifth wiring layer D5 in addition to the wiring Da1, the wiring Da2, the wiring Da3, and the wiring Da4. Further, the second portion GR2 of the guard ring includes a contact plug Ca5 connecting the wiring Da4 and the wiring Da5 in addition to the contact plug Ca1, the contact plug Ca2, the contact plug Ca3, and the contact plug Ca4.

The respective contact plugs Ca1 to Ca4 extend so as to surround the circuit formation region R1 when seen from the above. The contact plug Ca5 extends from one end of the second portion GR2 of the guard ring to the other end thereof when seen from the above.

In the embodiment, the wiring Da1 to wiring Da4 of the guard ring GR (the first portion GR1 of the guard ring and the second portion GR2 of the guard ring) are arranged at the same positions so as to overlap with one another when seen from the above. However, the invention is not limited to the mode and they may be arranged at different positions from one another when seen from the above. For example, it is sufficient that the wiring Da2 overlaps with a part of the wiring Da1, the wiring Da3 overlaps with a part of the wiring Da2, and the wiring Da4 overlaps with a part of the wiring Da3 when seen from the above. In this case, for example, it is sufficient that the contact plug Cat is provided on a region on which the wiring Da2 and the wiring Da 1 overlap with each other when seen from the above. In the same manner, the wiring Da5 may be arranged at the same position as the wirings Da1 to Da4 or may be arranged at a different position from the wirings Da1 to Da4.

Next, described are the connection terminals 40 with reference to FIG. 5.

As illustrated in FIG. 5, the connection terminals 40 are provided in the fifth wiring layer D5. The connection terminals 40 are electrically connected to the wiring Db4 of the fourth wiring layer D4 with contact plugs Cb5 penetrating through the fifth interlayer insulating layer Z5. That is to say, the connection terminals 40 are electrically connected to the driving circuit 30 and the like arranged on the internal circuit formation region R11 through the contact plugs Cb5 and the wiring Db4.

Openings Zuk are provided in the surface protection layer Zu and the sixth interlayer insulating layer Z6 at positions overlapping with the connection terminals 40 when seen from the above. Therefore, if the FPC substrate 7 is connected to the semiconductor device 1, a part of the conductive patterns 72 provided on the substrate 71 of the FPC substrate 7 are fitted into the openings Zuk so as to be connected to the connection terminals 40.

To be more specific, as illustrated in FIG. 5, each conductive pattern 72 includes a wiring layer 73 made of a conductive material, a resin layer 74, and a plurality of conductive particles 75. The plurality of conductive particles 75 are made of a conductive material and are provided in the resin layer 74. If the FPC substrate 7 is connected to the semiconductor device 1, the conductive particles 75 and the resin layers 74 are connected to the connection terminals 40. As a result, the connection terminals 40 and the wiring layers 73 are electrically connected to each other.

As described above, the plurality of conductive patterns 72 (plurality of wiring layers 73) are patterned on the substrate 71 so as to correspond to the connection terminals 40. The control signals of various types or the image signals are output to each of the plurality of wiring layers 73 from the control circuit 77. Then, if the semiconductor device 1 and the FPC substrate 7 are connected, the respective conductive patterns 72 are connected to the connection terminals 40 corresponding to the conductive patterns 72.

Therefore, the driving circuit 30 provided on the circuit formation region R1 is electrically connected to the wiring layers 73 included in the FPC substrate 7 through the conductive particles 75, the connection terminals 40, the contact plugs Cb5, and the wiring Db4 of the fourth wiring layer D4. With this, the control signals of various types and the image signals that are output from the control circuit 77 are supplied to the driving circuit 30.

Next, described is a configuration of the power supply unit 50 with reference to FIG. 3, FIG. 4, and FIG. 6.

As illustrated in FIG. 3 and FIG. 6, the semiconductor device 1 is provided with the power supply unit 50 on the circuit formation region R1. As illustrated in FIG. 4 and FIG. 6, the first P-type impurity diffusion layer Pp1 is provided on the circuit formation region R1 on the semiconductor substrate 150 of the semiconductor device 1.

As illustrated in FIG. 6, the power supply unit 50 includes wirings Dc1 to Dc5 and contact plugs Cc2 to Cc5. The wirings Dc1 to Dc5 are provided on the first wiring layer D1 to the fifth wiring layer D5, respectively. The contact plugs Cc2 to Cc5 electrically connect these terminals. Further, the power supply unit 50 includes a contact plug Cc1 that electrically connects the wiring Dc1 and the first P-type impurity diffusion layer Pp1.

A potential VSS is supplied to the wiring Dc5 of the power supply unit 50. Therefore, the potential VSS is supplied to the first P-type impurity diffusion layer Pp1 from the power supply unit 50. As a result, the potential of the semiconductor substrate 150 is kept at the potential VSS or a potential closer to the potential VSS stably. In addition, the potential of the guard ring GR that is connected to the semiconductor substrate 150 is also kept at the potential VSS or the potential closer to the potential VSS stably.

As described above, the second portion GR2 of the guard ring GR in the embodiment includes the wiring Dc5 as the fifth wiring layer D5 in addition to the wiring Da1 to the wiring Da4 as the first wiring layer D1 to the fourth wiring layer D4. On the other hand, the first portion GR1 of the guard ring GR in the embodiment does not include the wiring Dc5. In other words, the fourth wiring layer D4 as the wiring layer that is the farthest from the semiconductor substrate 150 among the wiring layers on which the first portion GR1 of the guard ring is provided corresponds to the wiring layer closer to the semiconductor substrate 150 relative to the fifth wiring layer D5 on which the connection terminals 40 are provided.

Figure 7:
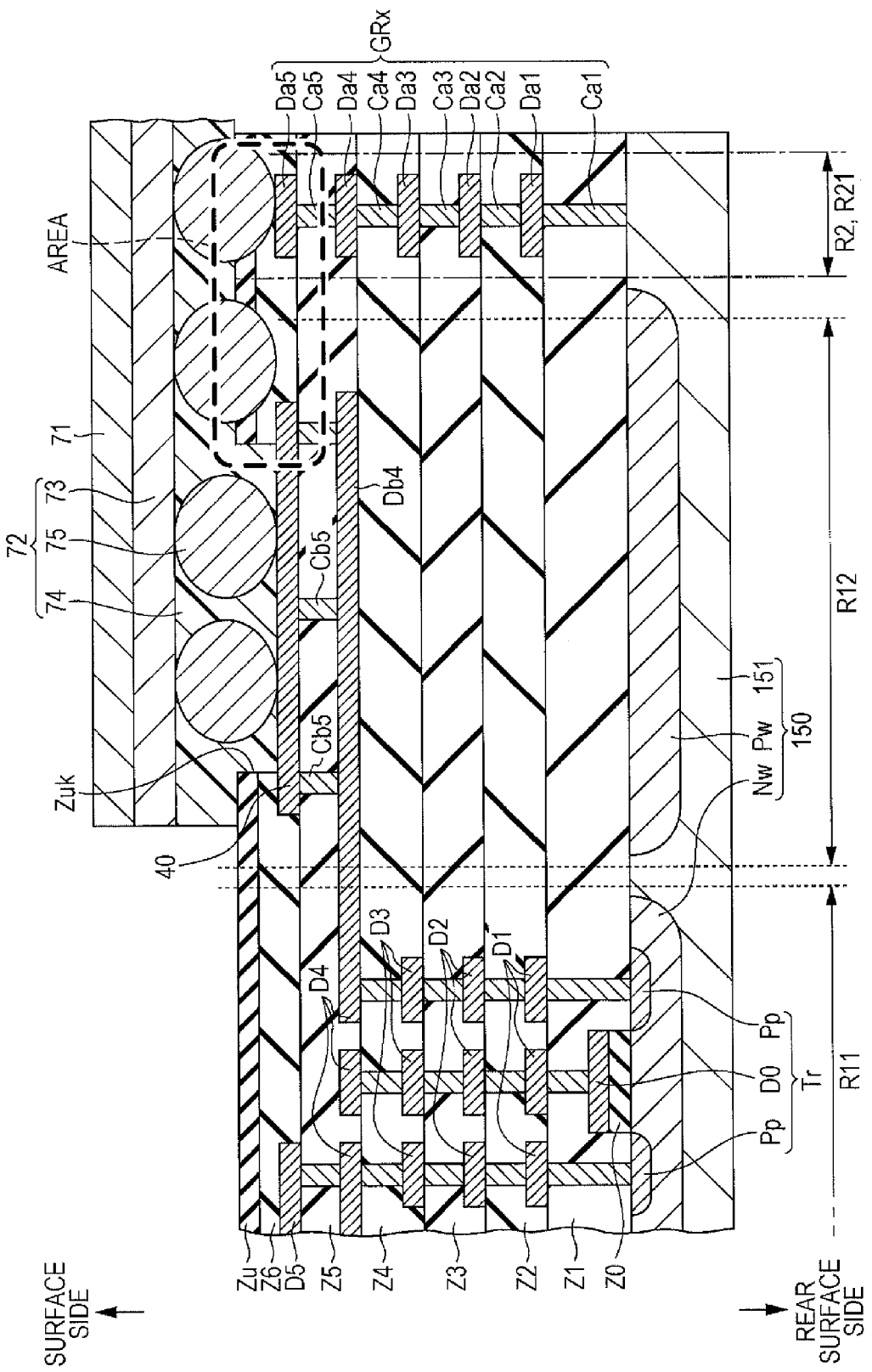
FIG. 7 is a partial cross-sectional view illustrating a configuration of a semiconductor device according to a comparative example.

In order to explain effects of the configuration of the guard ring GR, described is a problem that arises on a semiconductor device according to a comparative example as illustrated in FIG. 7.

The semiconductor device according to the comparative example is configured in the same manner as the semiconductor device 1 according to the embodiment other than a point that the guard ring overall is provided on five wiring layers from the first wiring layer D1 to the fifth wiring layer D5. That is to say, the configuration of the semiconductor device according to the comparative example can be expressed by using the partial cross-sectional view as illustrated in FIG. 7 instead of the partial cross-sectional view as illustrated in FIG. 5 among the drawings as illustrated in FIG. 3 to FIG. 6.

FIG. 7 is a partial cross-sectional view by cutting the semiconductor device according to the comparative example along the line VII-VII in FIG. 3 (and FIG. 4). As illustrated in FIG. 7, a guard ring GRx of the semiconductor device according to the comparative example includes the wiring Da5 as the fifth wiring layer D5 in addition to the wiring Da1 to wiring Da4 on the connection region R21.

If the state where the semiconductor device and the FPC substrate 7 are connected is continued, as illustrated in a partial Area in FIG. 7, the conductive particles 75 included in the FPC substrate 7 break through the surface protection layer Zu and the sixth interlayer insulating layer Z6 of the semiconductor device so as to enter the semiconductor device 1 in some cases. In this case, as illustrated in the partial Area in FIG. 7, there is a possibility that the conductive particles 75 and the guard ring GRx short-circuit.

If the conductive particles 75 and the guard ring GRx short-circuit, the control signals of various types or the image signals that are output from the control circuit 77 of the FPC substrate 7 are not supplied to the semiconductor device in some cases. Further, if the conductive particles 75 and the guard ring GRx short-circuit, the potential of the guard ring GRx fluctuates with the potential of the wiring layers 73. The fluctuation in the potential of the guard ring GRx is transmitted, as noise, to the circuits arranged on the internal circuit formation region R 11.

Thus, if the conductive particles 75 and the guard ring GRx short-circuit, the driving circuit 30 and the pixel circuits 110 are incapable of operating stably and accurately in some cases. To be specific, the pixels included in the display portion 10 cannot display gradation levels defined by image data accurately, resulting in lowering in display quality on the display portion 10 in some cases.

In order to solve this problem, in the embodiment, as illustrated in FIG. 5, the first portion GR1 of the guard ring does not include the fifth wiring layer D5, and the fourth wiring layer D4 as the wiring layer that is the farthest from the semiconductor substrate 150 among the wiring layers on which the first portion GR1 of the guard ring is provided corresponds to a wiring layer closer to the semiconductor substrate 150 relative to the fifth wiring layer D5 on which the connection terminals 40 are provided.

Figure 8:
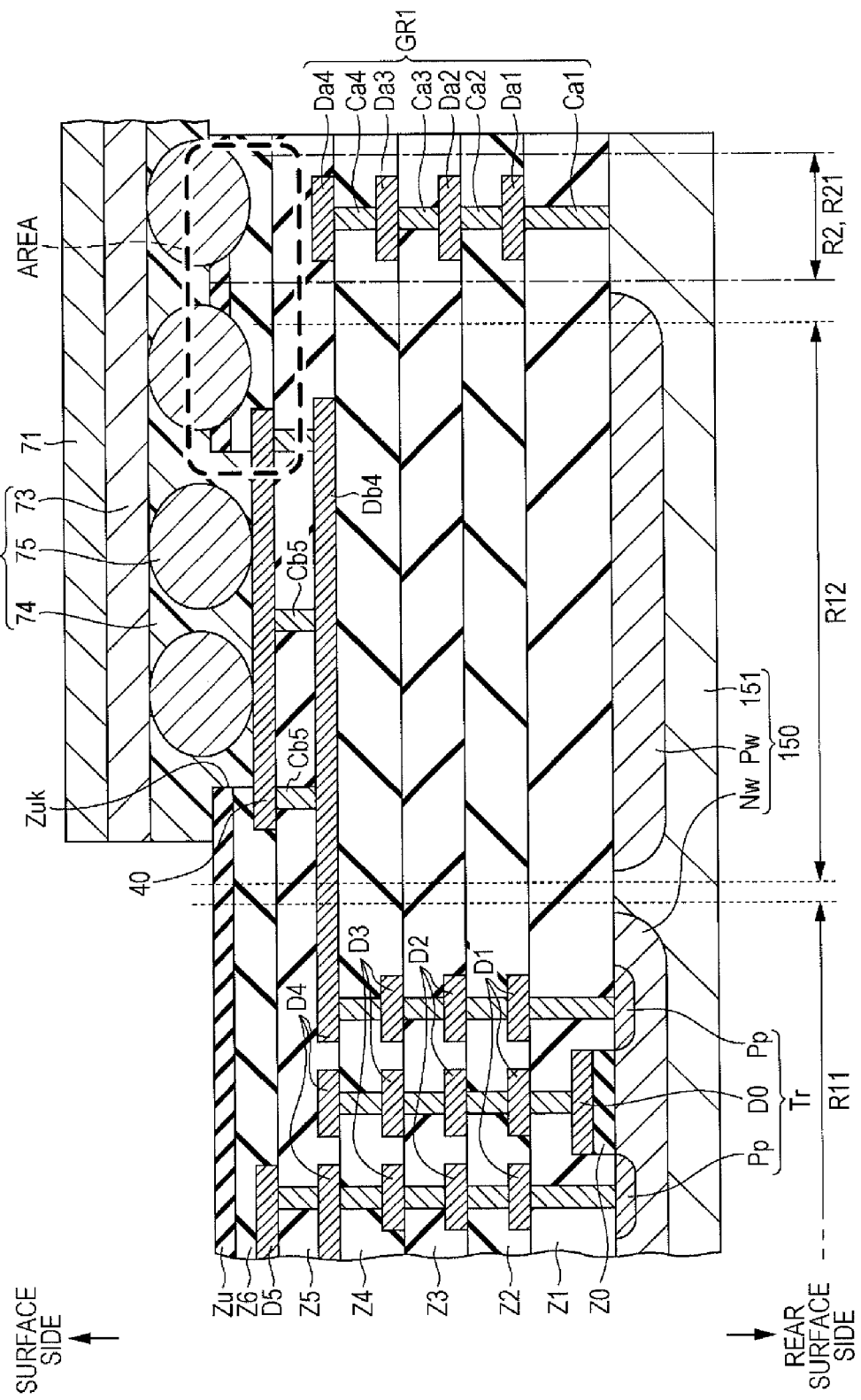
FIG. 8 is a partial cross-sectional view illustrating a configuration of the semiconductor device according to the first embodiment.

Therefore, even when the conductive particles 75 break through the surface protection layer Zu and the sixth interlayer insulating layer Z6 in the state where the semiconductor device 1 is connected to the FPC substrate 7 as illustrated in the partial Area in FIG. 8, short-circuit between the conductive particles 75 and the guard ring GR can be prevented from being generated. This makes it possible to stabilize the operations of the circuits arranged on the internal circuit formation region R11 in comparison with those in the comparison example.

In the comparative example in FIG. 7, in order to prevent short-circuit between the conductive particles 75 and the guard ring GR from being generated, it is considered that the protection layer Zu is made thicker in comparison with that of the semiconductor device 1 in the embodiment. However, when the surface protection layer Zu is made thicker, the FPC substrate 7 is pressed upward by the surface protection layer Zu in the partial Area in FIG. 7. Therefore, when the surface protection layer Zu is made thicker, a pressure that is applied to the conductive patterns 72 in the partial Area becomes larger in comparison with that of the semiconductor device 1 according to the embodiment. Due to this, a possibility that the conductive particles 75 break through the surface protection layer Zu becomes larger. In addition, the FPC substrate 7 is pressed and bent upward, so that the FPC substrate 7 may be damaged.

In contrast, the surface protection layer Zu is not made thicker on the partial Area in the embodiment. This makes it possible to suppress the possibility that the conductive particles 75 break through the surface protection layer Zu to be low. In addition, damage of the FPC substrate 7 due to the upward press and bending of the FPC substrate 7 can be prevented.

Moreover, in the semiconductor device 1 according to the embodiment, the potential VSS is supplied to the guard ring GR through the semiconductor substrate 150 from the power supply unit 50. With this, the potential of the guard ring GR is kept at the potential VSS or a potential closer to the potential VSS stably.

That is to say, the guard ring GR in the embodiment has a function as a physical shield that prevents entrance of moisture, oxygen, and the like into the semiconductor device 1. In addition, the guard ring GR in the embodiment has a function as an electric and magnetic shield that protects the circuits formed in the semiconductor device 1 from electric noise or magnetic noise from the outside of the semiconductor device 1.

Therefore, in the semiconductor device 1 according to the embodiment, circuits of various types that are arranged on the internal circuit formation region R11 can be operated stably.

Further, in the semiconductor device 1 according to the embodiment, the guard ring GR is formed on the peripheral region R2 surrounding the circuit formation region R1. Therefore, the guard ring GR can shield the connection terminals 40 formed on the connection terminal formation region R12 in addition to the circuits of various types that are formed on the internal circuit formation region R11 physically and electrically.

Second Embodiment

In the above-mentioned first embodiment, the P-well Pw is provided on the circuit formation region R1 and is not provided on the peripheral region R2. The second embodiment is different from the first embodiment in a point that the P-well Pw is provided on both of the circuit formation region R1 and the peripheral region R2.

Hereinafter, described is a semiconductor device according to the second embodiment with reference to FIG. 9 and FIG. 10. Actions and functions in the respective modes, which will be described below, that are the same as those in the first embodiment are explained with reference numerals referred in the above description and detail description thereof is omitted appropriately.

Figure 9:
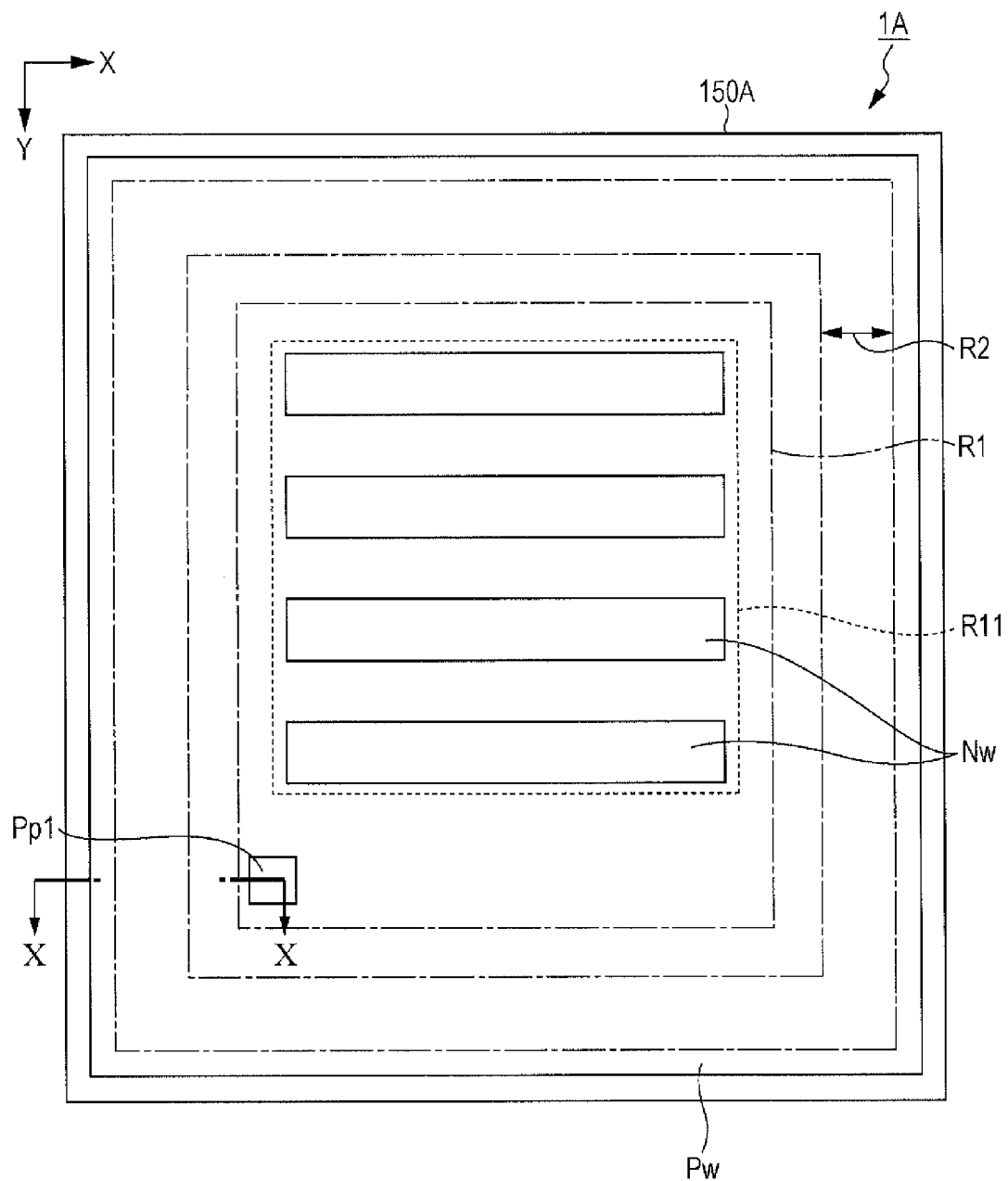
FIG. 9 is a descriptive view for explaining a semiconductor substrate of a semiconductor device according to a second embodiment.

FIG. 9 is a descriptive view illustrating a main surface of a semiconductor substrate 150A included in a semiconductor device 1A according to the second embodiment. FIG. 10 is a partial cross-sectional view by cutting the semiconductor device 1A along a line X-X in FIG. 9.

Figure 10:
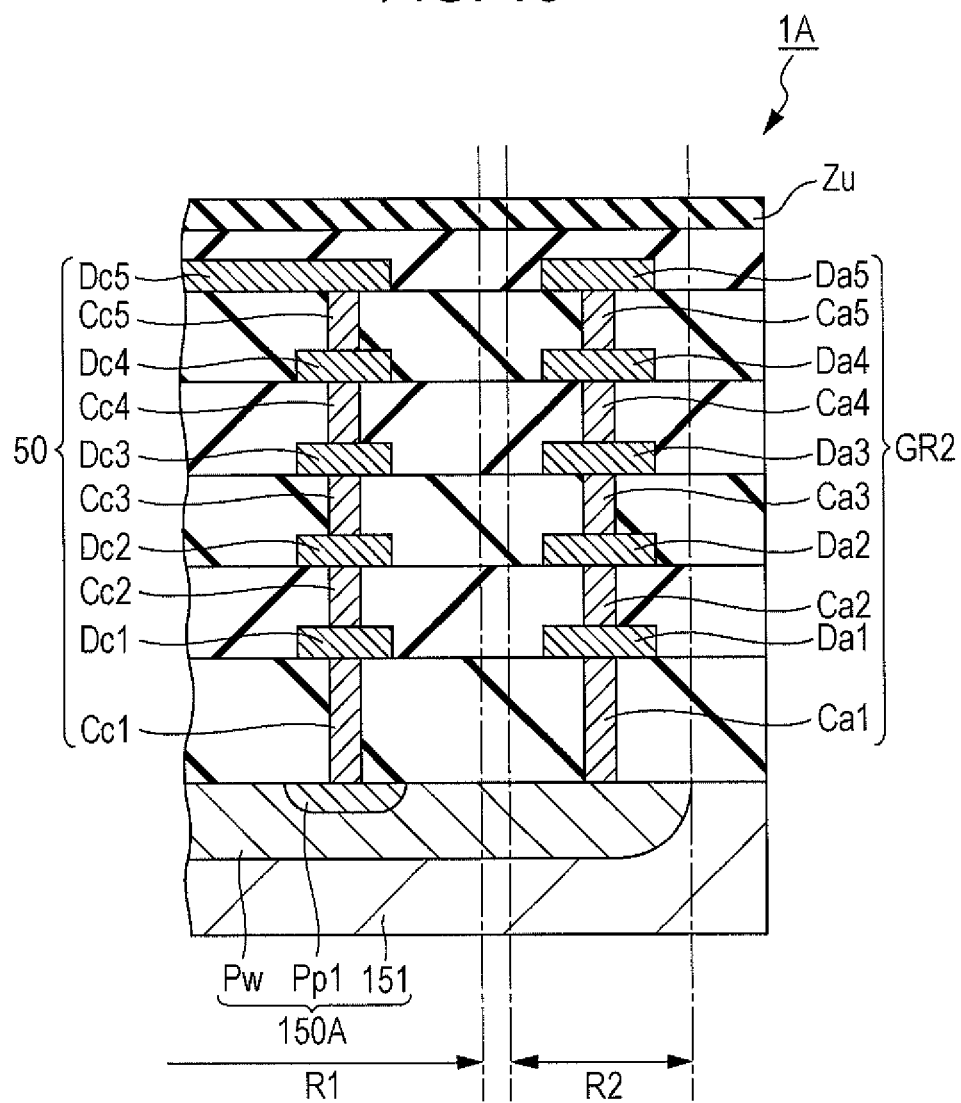
FIG. 10 is a partial cross-sectional view illustrating a configuration of the semiconductor device.

As illustrated in FIG. 9 and FIG. 10, the semiconductor substrate 150A includes the P-type semiconductor layer 151, and the P-well Pw and the N-wells Nws that are formed on the P-type semiconductor layer 151. The N-wells Nws are provided on a part of the internal circuit formation region R11. The P-well Pw is provided so as to cover the peripheral region R2 and the region of the circuit formation region R1 excluding the regions on which the N-wells Nws are provided. The semiconductor substrate 150A includes one or a plurality of P-type impurity diffusion layers Pps including the first P-type impurity diffusion layer Pp1 on the circuit formation region R1.

Thus, in the embodiment, the main surface of the semiconductor substrate 150A is covered by the N-wells Nws, the P-well Pw, or the P-type impurity diffusion layer Pp on the circuit formation region R1. On the other hand, the main surface of the semiconductor substrate 150A is covered by the P-well Pw on the peripheral region R2.

In the embodiment, provided is the region on which the P-well Pw is provided so as to be distanced from the outer edge of the semiconductor substrate 150A by a predetermined space. However, the invention is not limited to the configuration and the P-well Pw may be provided to the outer edge of the semiconductor substrate 150A.

Further, in the embodiment, the P-well Pw is provided on the peripheral region R2 overall on the main surface of the semiconductor substrate 150A. However, it is sufficient that the P-well Pw is provided on at least a part of the peripheral region R2.

As illustrated in FIG. 10, the guard ring GR included in the semiconductor device 1A is connected to the P-well Pw provided on the peripheral region R2. Therefore, the potential VSS or a potential closer to the potential VSS is supplied to the guard ring GR from the power supply unit 50 through the first P-type impurity diffusion layer Pp1 and the P-well Pw.

In this manner, in the embodiment, the P-well Pw is provided on the peripheral region R2 and the P-well Pw provided on the peripheral region R2 and the guard ring GR are connected to each other. Therefore, the potential of the guard ring GR can be kept at a potential that is much closer to the potential VSS stably in comparison with the guard ring GR in the first embodiment.

Third Embodiment

In the above-mentioned second embodiment, the semiconductor substrate 150A includes the P-well Pw on the peripheral region R2. However, a third embodiment is different from the second embodiment in a point that a semiconductor substrate includes the P-well Pw and the P-type impurity diffusion layer Pp on the peripheral region R2.

Hereinafter, described is a semiconductor device according to the third embodiment with reference to FIG. 11 and FIG. 12. Actions and functions in the respective modes, which will be described below, that are the same as those in the first embodiment are explained with reference numerals referred in the above description and detail description thereof is omitted appropriately.

Figure 11:
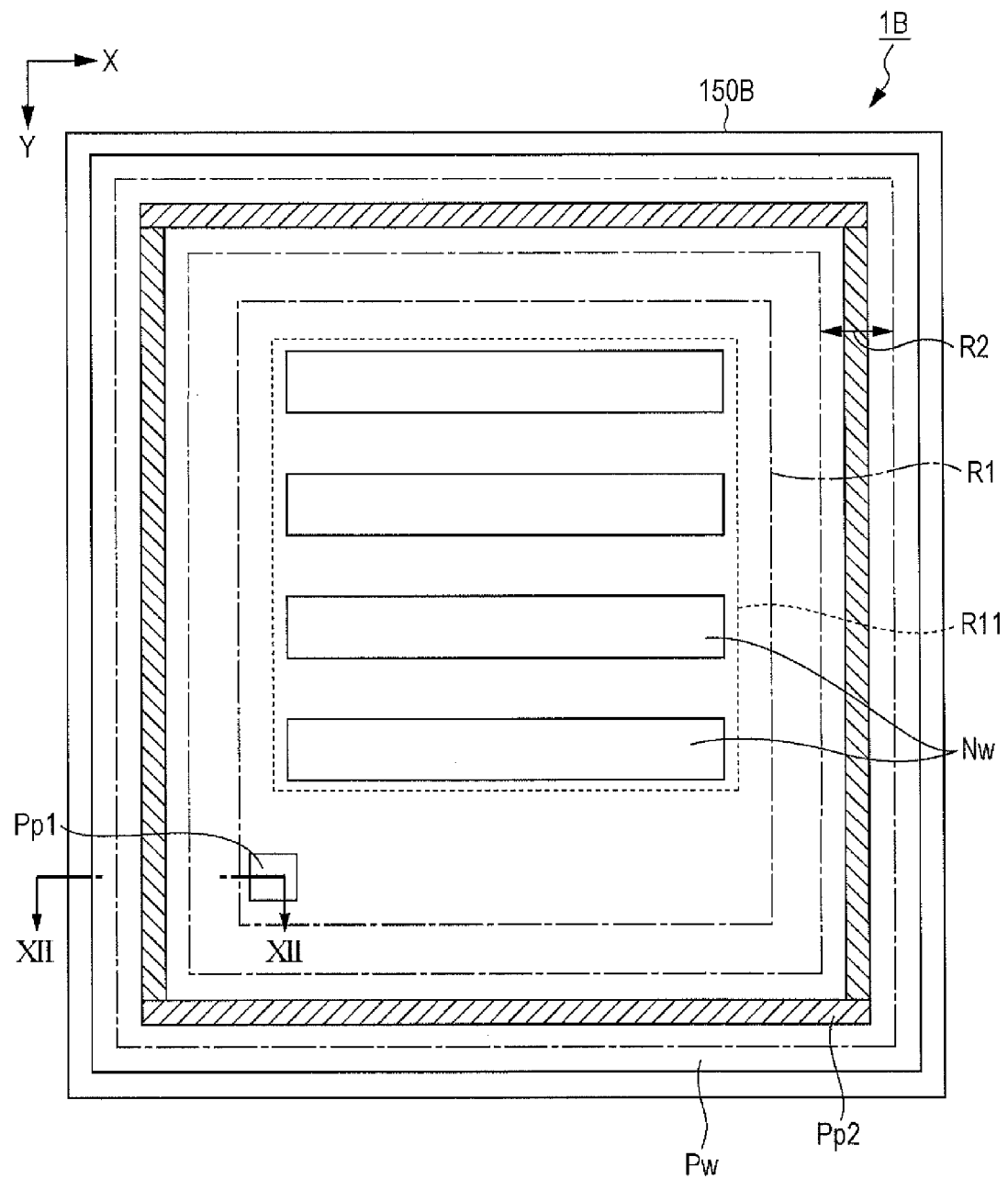
FIG. 11 is a descriptive view for explaining a semiconductor substrate of a semiconductor device according to a third embodiment.

FIG. 11 is a descriptive view illustrating a main surface of a semiconductor substrate 150B included in a semiconductor device 1B according to the third embodiment. FIG. 12 is a partial cross-sectional view by cutting the semiconductor device 1B along a line XII-XII in FIG. 11.

Figure 12:
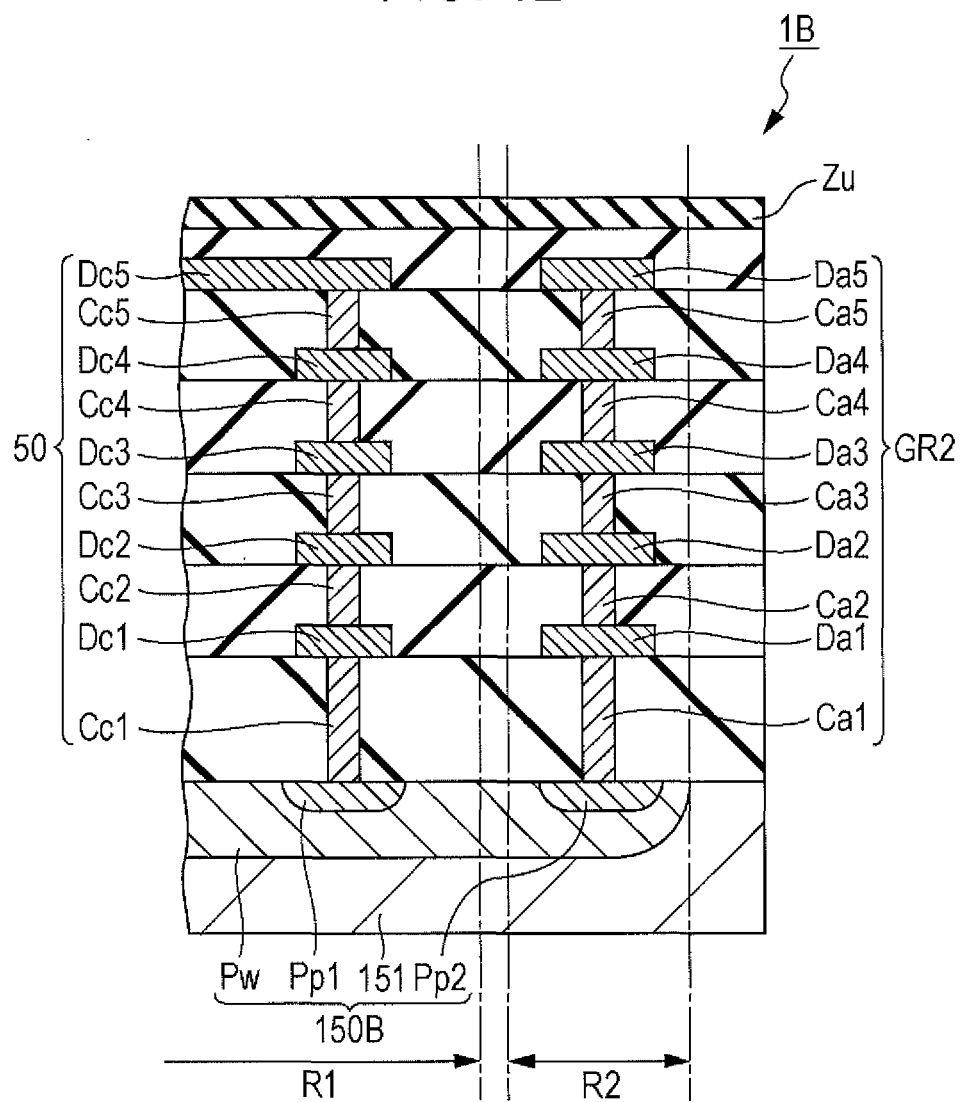
FIG. 12 is a partial cross-sectional view illustrating a configuration of the semiconductor device.

As illustrated in FIG. 11 and FIG. 12, the semiconductor substrate 150B includes the P-type semiconductor layer 151, and the P-well Pw and the N-wells Nws that are formed on the P-type semiconductor layer 151. The N-wells Nws are provided on a part of the internal circuit formation region R11. The P-well Pw is provided so as to cover the peripheral region R2 and the region of the circuit formation region R1 excluding the regions on which the N-wells Nws are provided. The semiconductor substrate 150B includes a plurality of P-type impurity diffusion layers Pps including the first P-type impurity diffusion layer Pp1 provided on the circuit formation region R1 and a second P-type impurity diffusion layer Pp2 (serving as an example of "second impurity diffusion layer") provided on the peripheral region R2.

Thus, in the embodiment, the main surface of the semiconductor substrate 150B is covered by the P-well Pw and the second P-type impurity diffusion layer Pp2 on the peripheral region R2.

In the embodiment, provided is the region on which the P-well Pw is provided so as to be distanced from the outer edge of the semiconductor substrate 150B by a predetermined space. However, the invention is not limited to the configuration and the P-well Pw may be provided to the outer edge of the semiconductor substrate 150B.

As illustrated in FIG. 12, the guard ring GR included in the semiconductor device 1B is connected to the second P-type impurity diffusion layer Pp2 formed on the P-well Pw provided on the peripheral region R2. Therefore, the potential VSS or a potential closer to the potential VSS is supplied to the guard ring GR from the power supply unit 50 through the first P-type impurity diffusion layer Pp1, the P-well Pw, and the second P-type impurity diffusion layer Pp2.

In this manner, in the embodiment, the P-well Pw and the second P-type impurity diffusion layer Pp2 are provided on the peripheral region R2 and the second P-type impurity diffusion layer Pp2 provided on the peripheral region R2 and the guard ring GR are connected to each other. Therefore, the potential of the guard ring GR can be kept at a potential that is much closer to the potential VSS stably in comparison with the guard ring GR in the second embodiment.

Variations

The invention is not limited to the above-mentioned embodiments and various variations as will be described later can be made. Further, one or a plurality of variations of the following variations, which have been selected arbitrarily, can be also combined appropriately.

First Variation

In the above-mentioned embodiments, the first portion GR1 of the guard ring is provided on the connection region R21 and the second portion GR2 of the guard ring is provided on the region of the peripheral region R2 excluding the connection region R21. However, the invention is not limited to the configuration. It is sufficient that the first portion GR1 of the guard ring is provided on a region including at least the connection region R21, which is larger than the connection region R21. In addition, it is sufficient that the second portion GR2 of the guard ring is provided on a part or the entire of the peripheral region R2 excluding the connection region R21.

Figure 13:
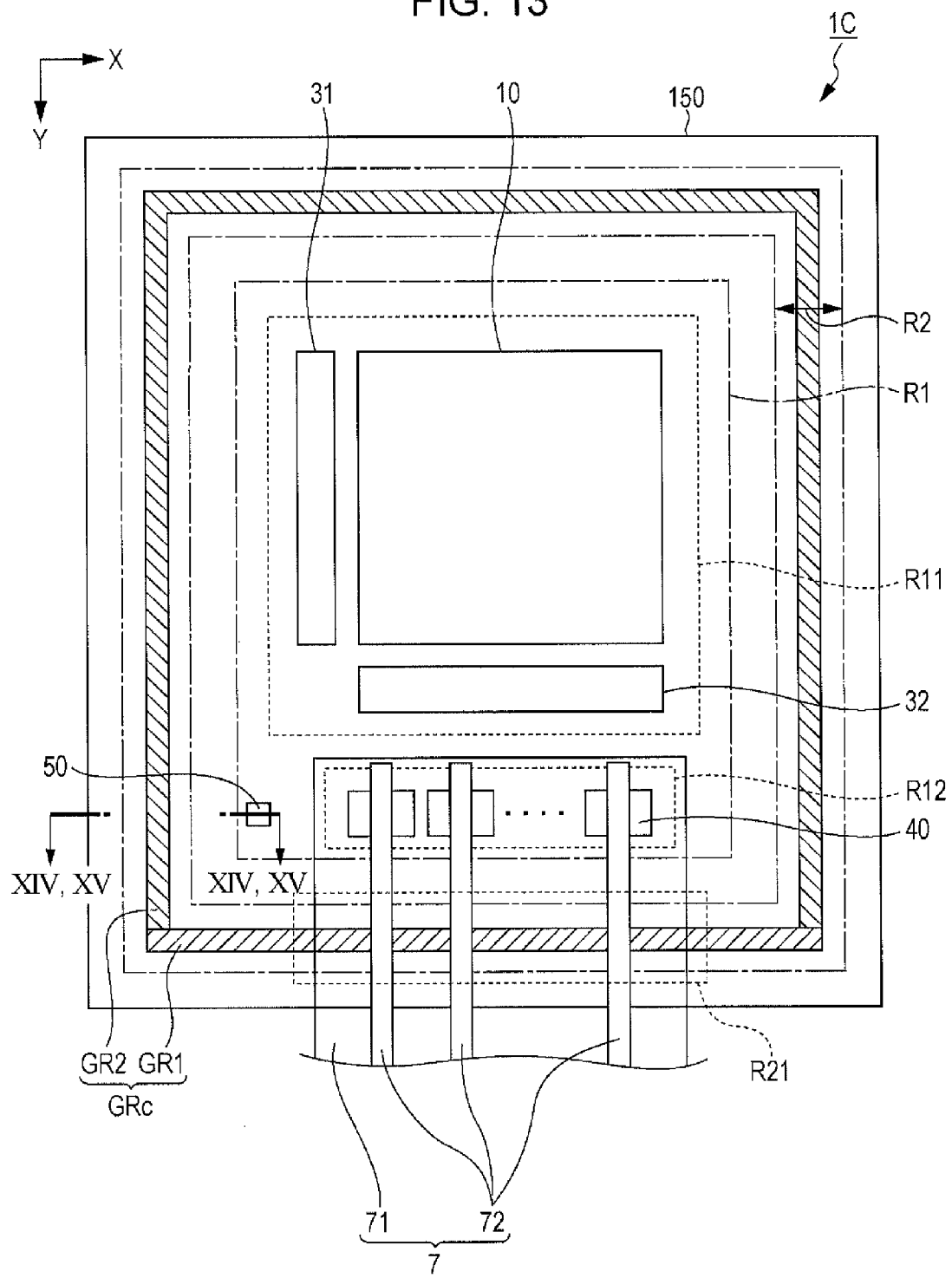
FIG. 13 is a plan view illustrating an outline of a semiconductor device according to a first variation.

FIG. 13 is a plan view illustrating an outline of a semiconductor device 1C according to the variation. The semiconductor device 1C is configured in the same manner as the semiconductor device 1 according to the first embodiment as illustrated in FIG. 3 other than the following point. That is, the semiconductor device 1C includes a guard ring GRc instead of the guard ring GR.

The guard ring GRc is configured in the same manner as the guard ring GR in the first embodiment other than the following point. That is, the guard ring GRc has a square shape when seen from the above and the entire side (lower side in FIG. 13) intersecting with the FPC substrate 7 among four sides constituting the guard ring GRc corresponds to the first portion GR1 and the remaining three sides (upper, left, and right sides in FIG. 13) correspond to the second portion GR2.

As described above, the first portion GR1 of the guard ring does not include the wiring Dc5. The fourth wiring layer D4 as the wiring layer that is the farthest from the semiconductor substrate 150 among the wiring layers on which the first portion GR1 of the guard ring is provided corresponds to the wiring layer closer to the semiconductor substrate 150 relative to the fifth wiring layer D5 on which the connection terminals 40 are provided. Therefore, as illustrated in FIG. 13, the first portion GR1 of the guard ring is provided on the region which is larger than the connection region R21 as the region intersecting with the FPC substrate 7 when seen from the above, thereby preventing short-circuit between the conductive particles 75 of the FPC substrate 7 and the guard ring more reliably.

Second Variation

In the above-mentioned embodiments and variation, the semiconductor device includes the semiconductor substrate. However, the invention is not limited to the mode and the semiconductor device may include a substrate other than the semiconductor substrate. For example, the semiconductor device may include a glass substrate instead of the semiconductor substrate. That is to say, in the invention, it is sufficient that the semiconductor device includes at least a semiconductor element such as a transistor provided on the semiconductor substrate and a thin-film transistor provided on the insulating substrate.

Figure 14:
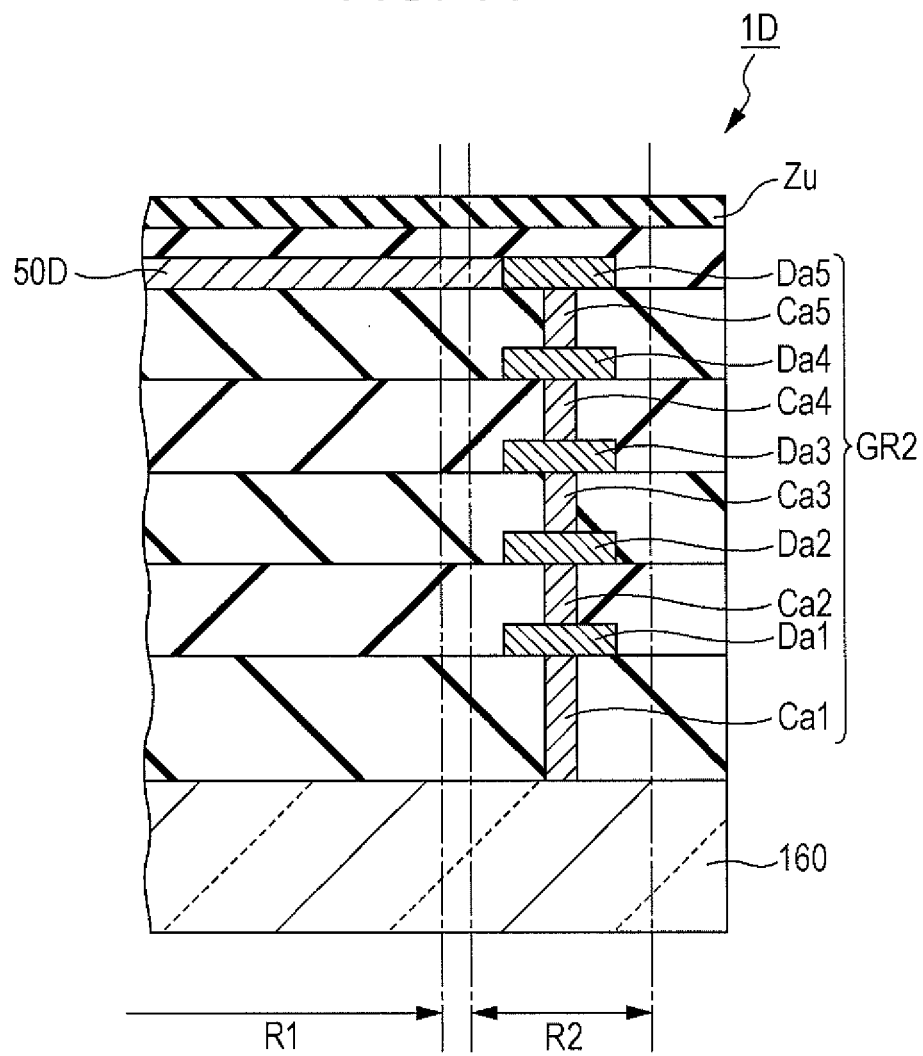
FIG. 14 is a partial cross-sectional view illustrating a configuration of a semiconductor device according to a second variation.

FIG. 14 is a partial cross-sectional view illustrating a semiconductor device 1D according to the variation. FIG. 14 is a view corresponding to FIG. 6 as the partial cross-sectional view of the semiconductor device 1 according to the first embodiment. As illustrated in FIG. 14, the semiconductor device 1D is configured in the same manner as the semiconductor device 1 in FIG. 6 according to the first embodiment other than the following points. That is, the semiconductor device 1D includes a glass substrate 160 instead of the semiconductor substrate 150 and includes a power supply unit 50D instead of the power supply unit 50. The potential VSS is supplied to the power supply unit 50D and the potential VSS is supplied to the guard ring GR through the power supply unit 50D. The power supply unit 50D is provided so as to be electrically insulated from the circuits of various types provided on the internal circuit formation region R11, such as the pixel circuits 110 and the driving circuit 30. Further, the guard ring GR is connected to the glass substrate 160.

Thus, the guard ring GR included in the semiconductor device 1D according to the variation is connected to the glass substrate 160 and the potential VSS is supplied to the guard ring GR from the power supply unit 50D. Therefore, the guard ring GR functions as a physical, electric, and magnetic shield for protecting the circuits provided on the internal circuit formation region R11 of the semiconductor device 1D.

Third Variation

In the above-mentioned embodiments and variations, the wiring layer that is the farthest from the semiconductor substrate among the wiring layers included in the second portion GR2 of the guard ring corresponds to the fifth wiring layer D5 as the same layer as the wiring layer on which the connection terminals 40 are provided. However, the invention is not limited to the mode and the second portion GR2 of the guard ring may include only the same wiring layers as those included in the first portion GR1 of the guard ring.

Figure 15:
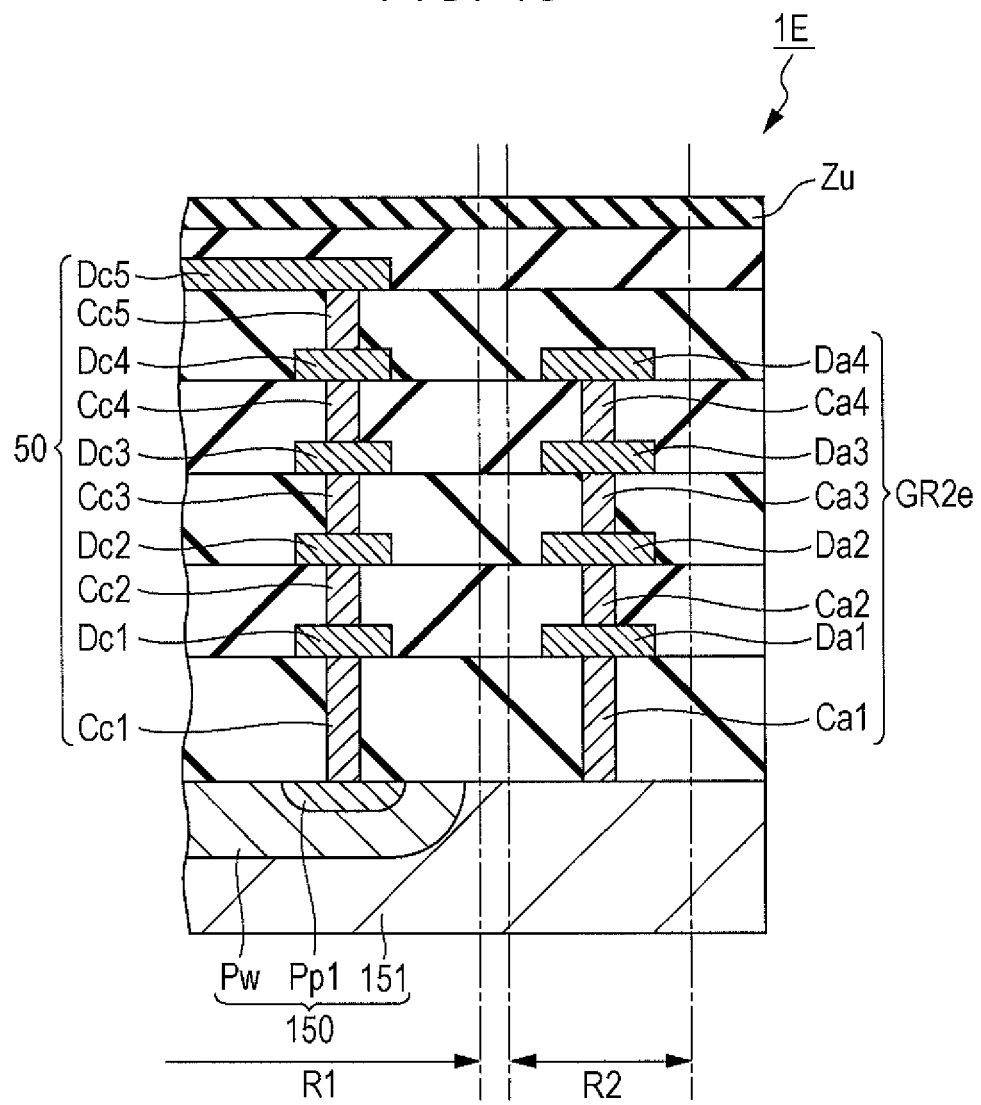
FIG. 15 is a partial cross-sectional view illustrating a configuration of a semiconductor device according to a third variation.

FIG. 15 is a partial cross-sectional view illustrating a semiconductor device 1E according to the variation. FIG. 15 is a view corresponding to FIG. 6 as the partial cross-sectional view of the semiconductor device 1 according to the first embodiment. As illustrated in FIG. 15, the semiconductor device 1E is configured in the same manner as the semiconductor device 1 in FIG. 6 according to the first embodiment other than the following point. That is, the semiconductor device 1E includes a second portion GR2e of the guard ring instead of the second portion GR2 of the guard ring. The second portion GR2e of the guard ring includes the wiring Da1 to the wiring Da4 as the first wiring layer D1 to the fourth wiring layer D4 but does not include the wiring Dc5 as the fifth wiring layer D5 as in the first portion GR1. Therefore, the semiconductor device 1E according to the variation is manufactured without the need for distinguishing the first portion GR1 and the second portion GR2 of the guard ring from each other. This makes it possible to manufacture the semiconductor device 1E easily in comparison with the semiconductor device 1 according to the first embodiment.

Fourth Variation

In the above-mentioned embodiments and variations, the semiconductor device includes five wiring layers formed by the first wiring layer D1 to the fifth wiring layer D5. However, the invention is not limited to the mode and the semiconductor device may include a plurality of wiring layers of equal to or more than six layers or equal to or less than four layers.

In FIG. 5, the number of wiring layers provided on the peripheral region R2, the connection terminal formation region R12, and the internal circuit formation region R11 are the same. However, the different number of wiring layers may be provided on the respective regions. For example, five wiring layers may be provided on the peripheral region R2 and the connection terminal formation region R12 and equal to or more than six wiring layers may be provided on the internal circuit formation region R11.

Fifth Variation

In the above-mentioned embodiments and variations, the wiring layer on which the connection terminals 40 are provided and the wiring layer that is the farthest from the semiconductor substrate 150 among the wiring layers included in the first portion GR1 of the guard ring are adjacent wiring layers. However, the invention is not limited to the configuration. Alternatively, one or a plurality of wiring layers may be provided between the two wiring layers.

For example, when the connection terminals 40 are provided as the fifth wiring layer D5, the wiring layer that is the farthest from the semiconductor substrate 150 among the wiring layers included in the first portion GR1 of the guard ring may be provided as the third wiring layer D3. In this case, a distance between the wiring layer that is the closest to the surface among the wiring layers included in the first portion GR1 of the guard ring and the FPC substrate 7 can be made longer. This makes it possible to prevent short-circuit between the guard ring GR and the conductive particles 75 from being generated more accurately.

Sixth Variation

In the above-mentioned embodiments and variations, the semiconductor device is provided with the pixel circuits 110 including the light emitting elements on the internal circuit formation region R11. However, the invention is not limited to the mode and the pixel circuits 110 may include liquid crystal elements.

The semiconductor device may include circuits other than the pixel circuits 110 for displaying an image on the internal circuit formation region R11. For example, the semiconductor device may include sensor circuits on the internal circuit formation region R11.

Seventh Variation

In the above-mentioned embodiments and variations, the potential of the guard ring is set to the potential VSS or the potential closer to the potential VSS but may be set to another potential. For example, the potential of the guard ring may be a potential VDD at the higher level side or a potential closer to the potential VDD or may be a power supply potential that is supplied to the driving circuit 30 or a potential closer to the power supply potential.

Eighth Variation

The control circuit 77 of the semiconductor chip is mounted on the FPC substrate 7 by the chip one film (COF) technique. However, all or a part of the functions of the control circuit 77 may be formed on the semiconductor device 1. For example, all or a part of the functions of the control circuit 77 may be formed in the circuit formation region R1 on the semiconductor device 1 in FIG. 3, for example, in the internal circuit formation region R11.

When all the functions of the control circuit 77 are formed on the semiconductor device 1, the FPC substrate 7 may be a substrate having only the wirings for transferring signals of digital image data and the like that are supplied from the high-level circuit to the plurality of connection terminals 40. In this case, the control circuit 77 need not be mounted by the COF technique. The functions of the control circuit 77 and the functions of the semiconductor device 1 can be created on the same semiconductor substrate, thereby reducing the number of parts.

Applications

Next, described are electronic apparatuses to which the semiconductor device according to the embodiments or variations is applied.

Figure 16:
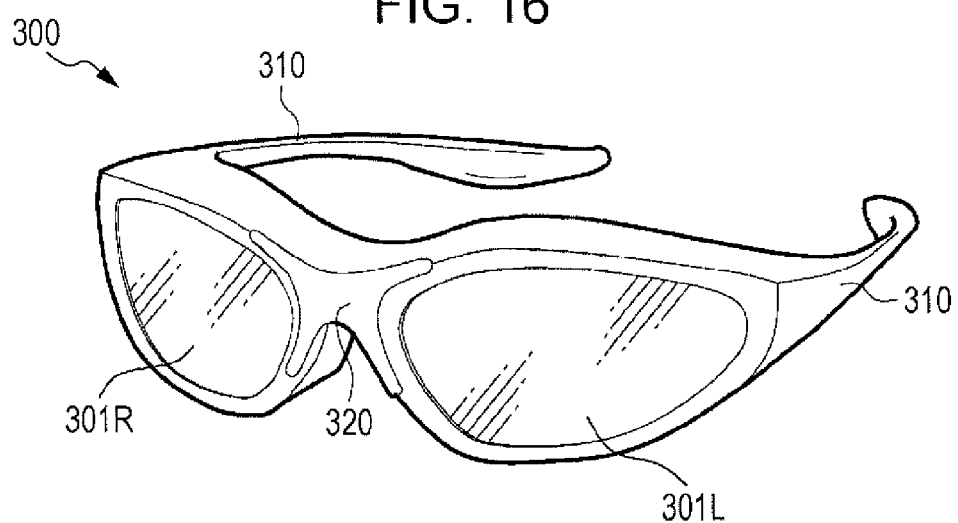
FIG. 16 is a perspective view illustrating an electronic apparatus (HMD).
Figure 17:
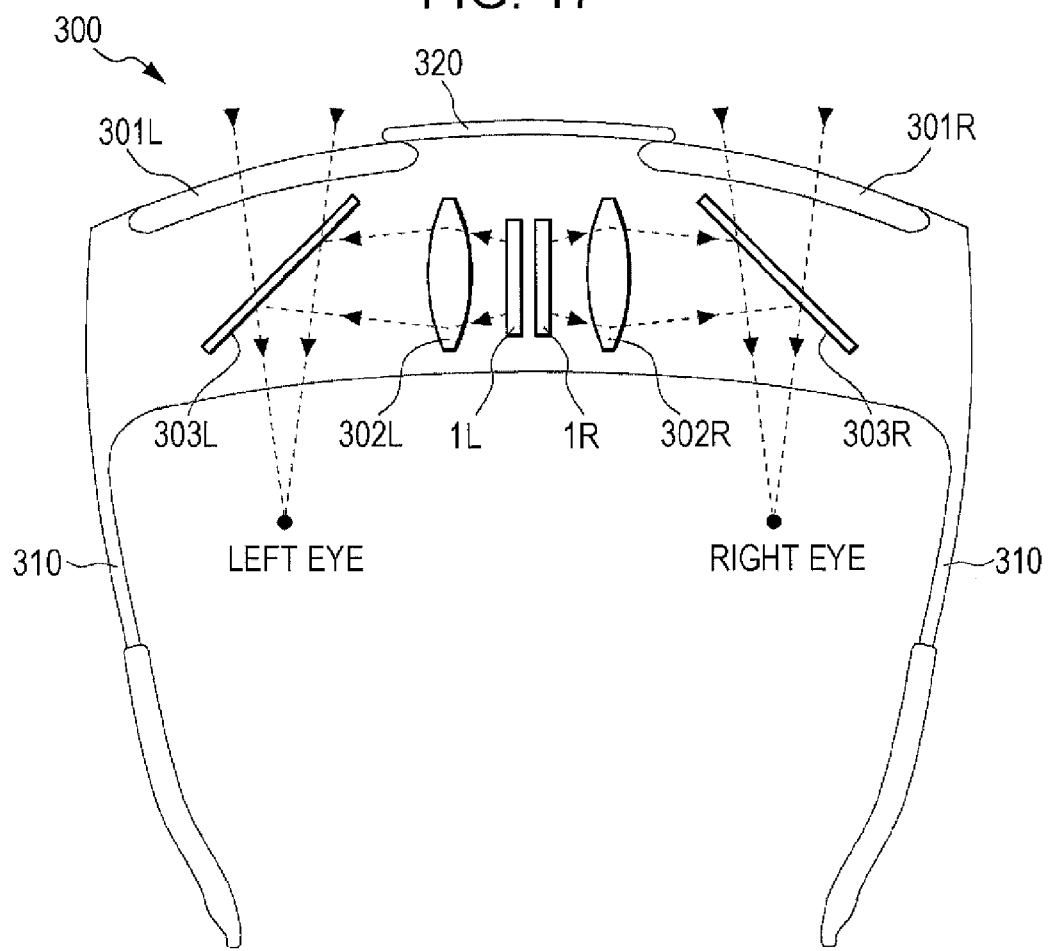
FIG. 17 is a view illustrating an optical configuration of the HMD.

FIG. 16 is a view illustrating an outer appearance of a head mounted display and FIG. 17 is a view illustrating an optical configuration thereof. First, as illustrated in FIG. 16, a head mounted display 300 includes temples 310, a bridge 320, and lenses 301L and 301R as in general glasses in appearance. Further, as illustrated in FIG. 17, the head mounted display 300 is provided with a semiconductor device 1L as a light emitting device for a left eye and a semiconductor device 1R as a light emitting device for a right eye at the rear side (lower side in FIG. 17) of the lenses 301L and 301R in the vicinity of the bridge 320. An image display surface of the semiconductor device 1L is arranged at the left side in FIG. 17. With this, a display image by the semiconductor device 1L is emitted in the direction of 9 o'clock through an optical lens 302L. A half mirror 303L reflects the display image by the semiconductor device 1L in the direction of 6 o'clock while makes light incident from the direction of 12 o'clock pass therethrough. An image display surface of the semiconductor device 1R is arranged at the right side opposite to the semiconductor device 1L. With this, a display image by the semiconductor device 1R is emitted in the direction of 3 o'clock in FIG. 17 through an optical lens 302R. A half mirror 303R reflects the display image by the semiconductor device 1R in the direction of 6 o'clock while makes light incident from the direction of 12 o'clock pass therethrough.

With this configuration, a person mounted with the head mounted display 300 can observe the display images by the semiconductor devices 1L and 1R in a see-through state where they are overlapped with the outside state. Further, the head mounted display 300 causes the semiconductor device 1L to display the image for the left eye of binocular images with parallax and causes the semiconductor device 1R to display the image for the right eye thereof. This makes it possible to cause the person mounted with the head mounted display 300 to perceive the display images as if the display images have the depth and stereoscopic sense (three-dimensional (3D) display).

Figure 18:
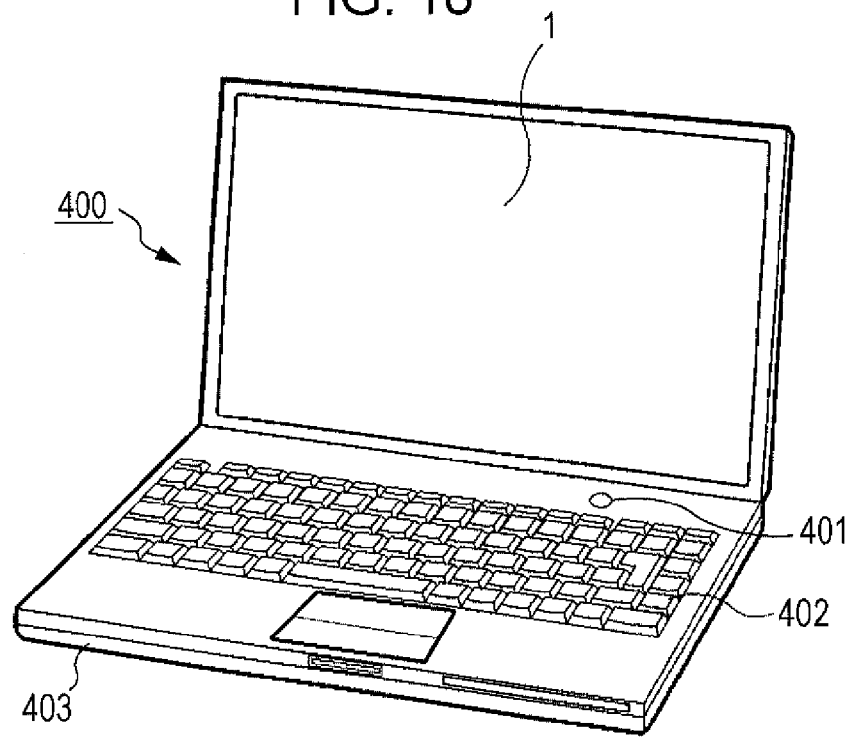
FIG. 18 is a perspective view illustrating an electronic apparatus (personal computer).

FIG. 18 is a perspective view illustrating a mobile personal computer employing the semiconductor device according to the embodiments or the variations. A personal computer 400 includes the semiconductor device 1 that displays images of various types, and a main body portion 403 on which a power supply switch 401 and a keyboard 402 are installed.

Figure 19:
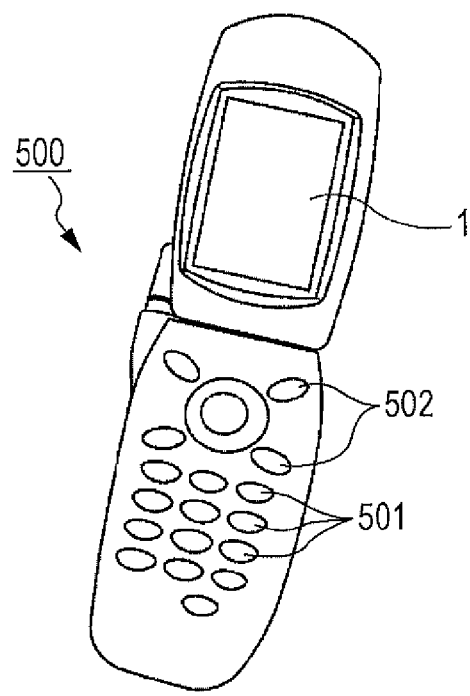
FIG. 19 is a perspective view illustrating an electronic apparatus (mobile phone).

FIG. 19 is a perspective view illustrating a mobile phone employing the semiconductor device according to the embodiments or the variations. A mobile phone 500 includes a plurality of operation buttons 501, scroll buttons 502, and the semiconductor device 1 displaying the images of various types. A screen that is displayed on the semiconductor device 1 is scrolled by operating the scroll buttons 502.

As the electronic apparatuses to which the semiconductor device according to the invention is applied, there are following apparatuses in addition to the apparatuses as illustrated in FIG. 16 to FIG. 19. That is, exemplified are apparatuses for displaying images such as a personal digital assistant (PDA), a digital still camera, a television, a car navigation system, an in-car display apparatus (instrument panel), an electronic organizer, an electronic paper, a calculator, a word processor, a workstation, a videophone, a POS terminal, a printer, a scanner, a copying machine, a video player, and an apparatus including a touch panel, sensors for capturing images, such as a complementary metal oxide semiconductor (CMOS) image sensor and a charge-coupled device (CCD) image sensor, and sensors such as an infrared array sensor.

The entire disclosure of Japanese Patent Application No. 2013-031079, filed Feb. 20, 2013 is expressly incorporated by reference herein

What is claimed is:

1. A semiconductor device that is connected to a wiring substrate comprising:
   a semiconductor substrate having an outer edge;
   a circuit provided on a circuit formation region of the semiconductor substrate;
   a connection terminal that is connected to a conductive pattern included in the wiring substrate and is provided on the circuit formation region; and
   a guard ring that includes a plurality of wiring layers and is provided on a peripheral region which is a region between the circuit formation region and the outer edge,
   wherein the guard ring is provided on a connection region, which overlaps with the wiring substrate, and
   in the connection region, a first wiring layer of the plurality of wiring layers of the guard ring, which is the farthest from the semiconductor substrate, corresponds to a wiring layer closer to the semiconductor substrate relative to a second wiring layer of the connection terminal, the second wiring layer of the connection terminal being farther from the semiconductor substrate than a first wiring layer of the connection terminal.

2. The semiconductor device according to claim 1, further comprising a power supply unit for supplying a predetermined potential to the semiconductor substrate,
   wherein the guard ring is connected to the semiconductor substrate.

3. The semiconductor device according to claim 2,
   wherein the semiconductor substrate includes an impurity injection layer, and
   the guard ring is connected to the impurity injection layer of the semiconductor substrate.

4. An electronic apparatus comprising the semiconductor device according to claim 3.

5. The semiconductor device according to claim 2,
   wherein the semiconductor substrate includes:
   a first impurity diffusion layer, and
   a second impurity diffusion layer,
   the power supply unit is connected to the first impurity diffusion layer, and
   the guard ring is connected to the second impurity diffusion layer.

6. An electronic apparatus comprising the semiconductor device according to claim 2.

7. An electronic apparatus comprising the semiconductor device according to claim 5.

8. The semiconductor device according to claim 1,
   wherein a third wiring layer included in the guard ring, which is the farthest from the semiconductor substrate, is provided on the same layer as the second wiring layer in a part or the entire of the peripheral region excluding the connection region.

9. An electronic apparatus comprising the semiconductor device according to claim 8.

10. The semiconductor device according to claim 1,
    wherein the guard ring includes a contact plug that electrically connects a first one of the plurality of wiring layers to a second of the plurality of wiring layers.

11. An electronic apparatus comprising the semiconductor device according to claim 10.

12. The semiconductor device according to claim 1,
    wherein the circuit includes a pixel circuit for displaying an image or a sensor circuit for capturing an image.

13. An electronic apparatus comprising the semiconductor device according to claim 12.

14. An electronic apparatus comprising the semiconductor device according to claim 1.

15. A semiconductor device that is connected to a wiring substrate comprising:
    a substrate having an outer edge;
    a circuit provided on a circuit formation region of the substrate;
    a power supply unit for supplying a predetermined potential and is provided on the circuit formation region;
    a connection terminal that is connected to a conductive pattern included in the wiring substrate and is provided on the circuit formation region; and
    a guard ring that includes a plurality of wiring layers and is provided on the peripheral region which is a region between the circuit formation region and the outer edge,
    wherein the predetermined potential is supplied to the guard ring from the power supply unit,
    wherein the guard ring is provided on a connection region, which overlaps with the wiring substrate, and
    in the connection region, a first wiring layer of the plurality of wiring layers of the guard ring, which is the farthest from the semiconductor substrate, corresponds to a wiring layer closer to the semiconductor substrate relative to a second wiring layer of the connection terminal, the second wiring layer of the connection terminal being farther from the semiconductor substrate than a first wiring layer of the connection terminal.

16. The semiconductor device according to claim 15,
    wherein the guard ring is connected to the substrate.

17. An electronic apparatus comprising the semiconductor device according to claim 16.

18. The semiconductor device according to claim 15,
    wherein a third wiring layer included in the guard ring, which is the farthest from the substrate, is provided on the same layer as the second wiring layer in a part or the entire of the peripheral region excluding the connection region.

19. An electronic apparatus comprising the semiconductor device according to claim 18.

20. An electronic apparatus comprising the semiconductor device according to claim 15.

* * * * *